United States Patent
Ebihara

(10) Patent No.: US 8,953,148 B2
(45) Date of Patent: Feb. 10, 2015

(54) EXPOSURE APPARATUS AND MAKING METHOD THEREOF

(75) Inventor: Akimitsu Ebihara, Fukaya (JP)

(73) Assignee: Nikon Corporation, Tokyo (JP)

(*) Notice: Subject to any disclaimer, the term of this patent is extended or adjusted under 35 U.S.C. 154(b) by 1305 days.

(21) Appl. No.: 11/646,499

(22) Filed: Dec. 28, 2006

(65) Prior Publication Data

US 2007/0206170 A1    Sep. 6, 2007

Related U.S. Application Data

(60) Provisional application No. 60/873,003, filed on Dec. 6, 2006.

(30) Foreign Application Priority Data

Dec. 28, 2005 (JP) ................................. 2005-380056
Nov. 30, 2006 (JP) ................................. 2006-323072

(51) Int. Cl.
G03B 27/32 (2006.01)
G03B 27/42 (2006.01)
G03F 7/20 (2006.01)

(52) U.S. Cl.
CPC ............ *G03B 27/42* (2013.01); *G03F 7/70833* (2013.01)
USPC .......................................................... 355/77

(58) Field of Classification Search
USPC ................. 355/30, 53, 67, 72, 75, 77
See application file for complete search history.

(56) References Cited

U.S. PATENT DOCUMENTS

| | | |
|---|---|---|
| 5,969,441 A | 10/1999 | Loopstra et al. |
| 6,590,634 B1 | 7/2003 | Nishi et al. |
| 6,611,316 B2 | 8/2003 | Sewell |
| 6,778,257 B2 | 8/2004 | Bleeker et al. |
| 6,891,603 B2 * | 5/2005 | Nishi ................. 355/77 |
| 6,897,963 B1 | 5/2005 | Taniguchi et al. |
| 6,952,253 B2 | 10/2005 | Lof et al. |
| 7,023,610 B2 | 4/2006 | Ohtsuki et al. |
| 2001/0028456 A1 * | 10/2001 | Nishi ................. 356/400 |
| 2002/0085190 A1 | 7/2002 | Nishi |
| 2003/0117596 A1 * | 6/2003 | Nishi ................. 355/51 |
| 2005/0110968 A1 | 5/2005 | Aichi et al. |
| 2005/0122490 A1 | 6/2005 | Luttikhuis et al. |

(Continued)

FOREIGN PATENT DOCUMENTS

EP    1 220 037 A2    7/2002
EP    1 420 298 A2    5/2004

(Continued)

OTHER PUBLICATIONS

Extended European Search Report No. EP 06 84 3610, dated Jun. 29, 2010.

(Continued)

*Primary Examiner* — Chia-how Michael Liu
(74) *Attorney, Agent, or Firm* — Oliff PLC

(57) ABSTRACT

An exposure apparatus that forms a pattern by exposing a substrate is equipped with a first platform tower, a second platform tower installed at a predetermined distance, and an exposure main section arranged within the space between both platform towers that includes a plurality of high rigidity sections each including a high rigidity component. Accordingly, it becomes possible to use a module (a high rigidity section) of the preceding generation even when the generation changes.

52 Claims, 12 Drawing Sheets

(56) References Cited

U.S. PATENT DOCUMENTS

| | | |
|---|---|---|
| 2005/0252506 A1 | 11/2005 | Sato |
| 2005/0259234 A1 | 11/2005 | Hirukawa et al. |
| 2005/0280791 A1 | 12/2005 | Nagasaka et al. |
| 2006/0231206 A1 | 10/2006 | Nagasaka et al. |

FOREIGN PATENT DOCUMENTS

| | | |
|---|---|---|
| EP | 1 630 585 A1 | 3/2006 |
| JP | A 10-214783 | 8/1998 |
| JP | A 2001-291663 | 10/2001 |
| JP | A 2004-519850 | 7/2004 |
| JP | A 2005-203754 | 7/2005 |
| WO | WO 98/40791 | 9/1998 |
| WO | WO 99/23692 | 5/1999 |
| WO | WO 99/23692 A1 | 5/1999 |
| WO | WO 99/46835 | 9/1999 |
| WO | WO 01/35168 A1 | 5/2001 |
| WO | WO 02/069049 A2 | 9/2002 |
| WO | WO 2004/053955 A1 | 6/2004 |
| WO | WO 2004/055803 A1 | 7/2004 |
| WO | WO 2004/057590 A1 | 7/2004 |
| WO | WO 2004/107011 A1 | 12/2004 |
| WO | WO 2005/074014 A1 | 8/2005 |

OTHER PUBLICATIONS

Office Action dated May 18, 2011 issued in European Patent Application No. 06 843 610.4.
Written Opinion dated Mar. 20, 2007 issued in PCT/JP2006/326232 (with translation).

* cited by examiner

EXPOSURE APPARATUS AND MAKING METHOD THEREOF

CROSS-REFERENCE TO RELATED APPLICATIONS

This non-provisional application claims the benefit of Provisional Application No. 60/873,003 filed Dec. 6, 2006, the disclosure of which is hereby incorporated herein by reference in its entirety.

BACKGROUND OF THE INVENTION

1. Field of the Invention

The present invention relates to exposure apparatus and making methods of the apparatus, and more particularly to an exposure apparatus that forms a pattern by exposing a substrate and a making method of the apparatus.

2. Description of the Background Art

In a lithography process for manufacturing microdevices (electronic devices) such as a semiconductor, a liquid crystal display device or the like, various types of exposure apparatus including a projection exposure apparatus such as a stepper or a scanning stepper have been conventionally used.

In the conventional exposure apparatus, a projection optical system, a reticle stage system, a wafer stage system and the like were sequentially assembled into a frame mechanism. This caused an inconvenience of requiring time for starting up the exposure apparatus (assembly adjustment), maintenance and the like, since the reticle stage system and the like also had to be detached from the frame mechanism when taking out the projection exposure apparatus to perform adjustment.

Therefore, in order to improve such an inconvenience, the applicant of the present invention has made a proposal of an exposure apparatus that can be assembled and adjusted easily and quickly (refer to Kokai (Japanese Patent Unexamined Application Publication) No. 2001-291663) by employing a module configuration for both a first stage chamber in which a first stage system which moves holding a first object (a reticle) is housed and is also detachably attached to a frame mechanism and a second stage chamber in which a second stage system which moves holding a second object (a wafer) is housed and is also detachably attached to the frame mechanism, and attaching each of the stage chambers to the frame mechanism, for example, after assembling both the first and second stage chambers in parallel.

However, integration of semiconductor devices is becoming higher and higher by generation, and in order to cope with this, the exposure apparatus disclosed in the above Kokai (Japanese Patent Unexamined Application Publication) No. 2001-291663 is also developed for each generation. As a consequence, when the generation changes, the frame mechanism also has to change, which caused an inconvenience of not being able to use the module of the previous generation.

SUMMARY OF THE INVENTION

The present invention was made under the above situation, and according to a first aspect of the present invention, there is provided a first exposure apparatus that forms a pattern by exposing a substrate, the apparatus comprising: a first frame and a second frame installed at a predetermined distance; and an exposure main section arranged within a space between the first frame and the second frame that includes a plurality of high rigidity sections each including a high rigidity component.

According to this apparatus, the exposure main section that includes a plurality of high rigidity sections each including a high rigidity component is arranged within the space between the first frame and the second frame, that is, the apparatus is not equipped with a frame mechanism that serves as a body. Accordingly, even if the generation changes (if the interface for attaching each high rigidity section to the frames does not change), it becomes possible to use the module of the preceding generation.

In this case, at least one of the plurality of high rigidity sections can include a plurality of high rigidity components and a connection member of a flexible structure that connects the high rigidity components. In such a case, by employing a connection member of a flexible structure the high rigidity components used can be reduced, which can reduce the manufacturing cost as well as suppress the travel of vibration, heat and the like between the high rigidity components when compared with the case using a connection member of a rigid structure.

According to a second aspect of the present invention, there is provided a making method of an exposure apparatus in which an exposure apparatus that forms a pattern by exposing a substrate is made, the method comprising: a process of respectively installing a first frame and a second frame on a predetermined surface; and a process of placing an exposure main section including a plurality of high rigidity sections distanced apart that each include a high rigidity component, in a space between the first frame and the second frame.

The predetermined surface includes, as a matter of course, the floor surface inside the factory (clean room) where the exposure apparatus is installed, as well as the upper surface of members installed on the floor surface such as the frame caster and the like.

According to this method, by a simple procedure of installing the first frame and the second frame each on a predetermined surface and sequentially placing a plurality of high rigidity sections each including a high rigidity component that constitutes an exposure main section in the space between the first frame and the second frame, the exposure main section can be assembled. In this case, the order of placing the plurality of high rigidity sections in the space between the first frame and the second frame is not an issue.

According to a third aspect of the present invention, there is provided a second exposure apparatus the exposes a substrate with an radiation beam, the apparatus comprising: a pair of frames installed at a predetermined distance; and an exposure main section attached to the pair of frames, the section including a plurality of high rigidity sections that each include a high rigidity component.

According to this apparatus, the exposure main section that includes a plurality of high rigidity sections including a high rigidity component is attached to the pair of frames installed at a predetermined distance. That is, the apparatus is not equipped with a frame mechanism that serves as a body.

BRIEF DESCRIPTION OF THE DRAWINGS

In the accompanying drawings.

DESCRIPTION OF THE EMBODIMENTS

Figure 1:
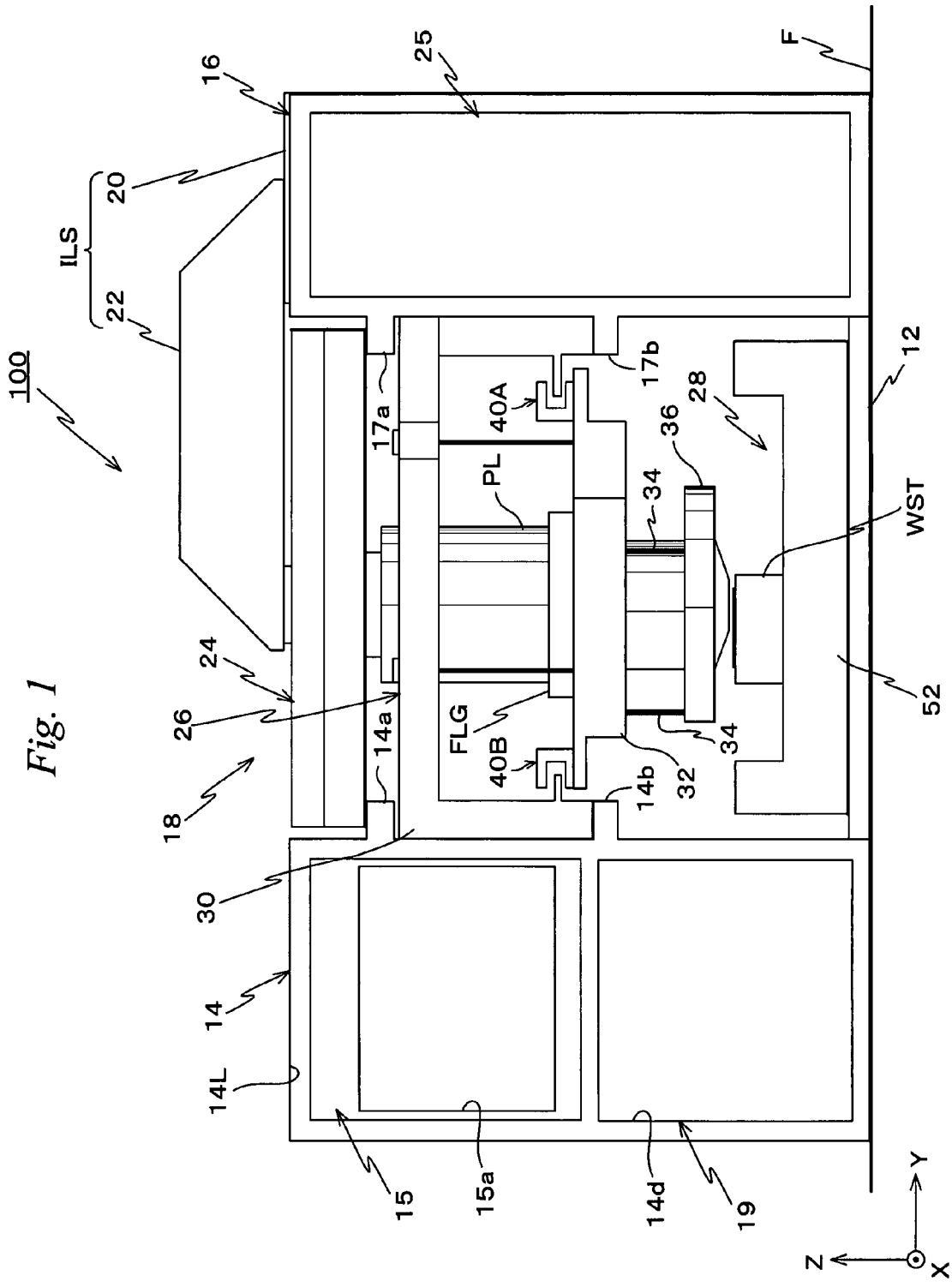
FIG. 1 is a view that shows a schematic configuration of an exposure apparatus related to a first embodiment.

Hereinafter, an embodiment of the present invention will be described, referring to FIGS. 1 to 15. FIG. 1 shows an entire view of an arrangement of an exposure apparatus 100 related to the embodiment of the present invention.

Exposure apparatus 100 is a scanning type exposure apparatus by a step-and-scan method, that is, the so-called scanning stepper. Exposure apparatus 100 is equipped with a first platform tower (frame) 14 and a second platform tower (frame) 16 placed a predetermined distance apart in a Y-axis direction in FIG. 1 on a floor surface F in a clean room with a rectangular base plate 12 in between, an exposure main section 18 placed in the space between the first platform tower 14 and the second platform tower 16, a light source (not shown), an illumination system ILS that includes an illumination optical system that has a first illumination unit 20 and second illumination unit 22, and the like.

The first platform tower 14 is a rectangular parallelepiped housing, and on the edge surface on the +Y side at different positions in a height direction (a Z-axis direction), a first guide bar 14a and a second guide bar 14b are arranged in a projected manner, each extending in an X-axis direction (a direction orthogonal to the page surface in FIG. 1).

Figure 9:
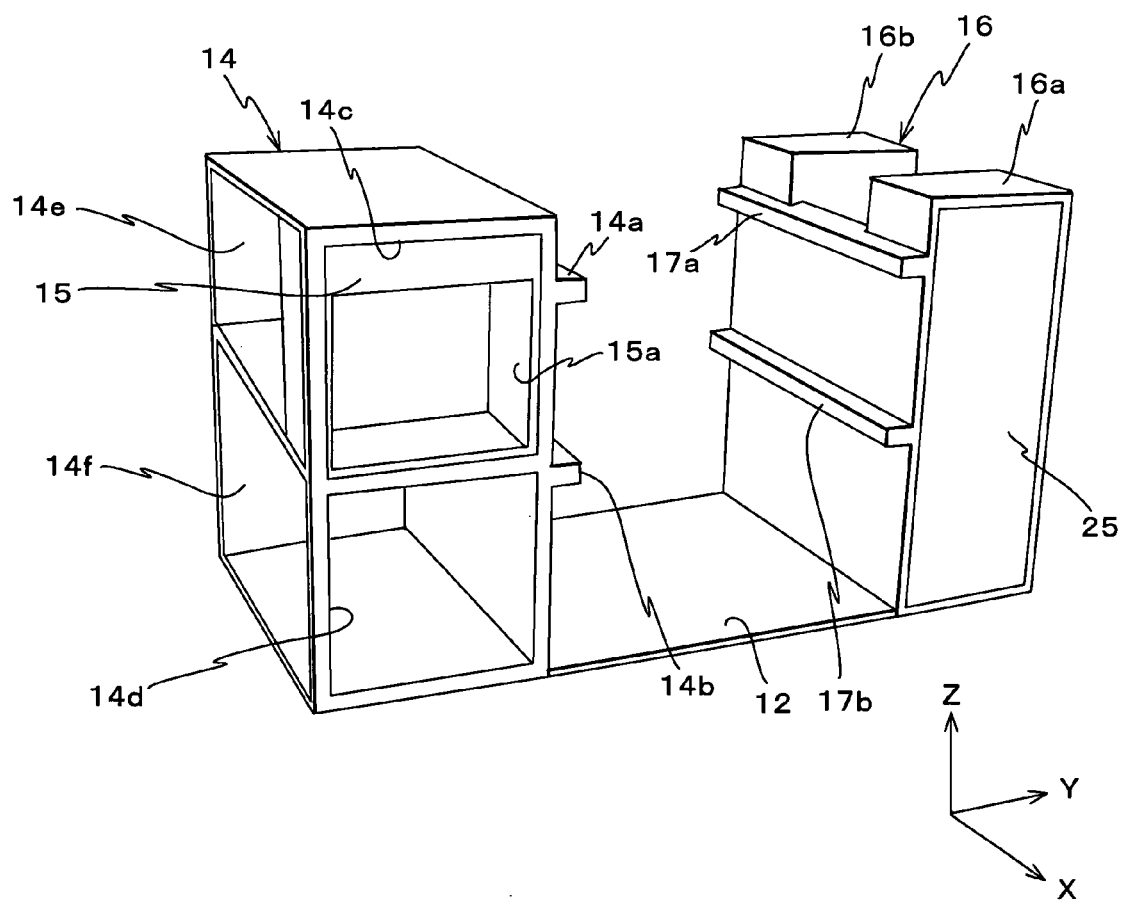
FIG. 9 is a view (No. 2) for describing a making process of the exposure apparatus.

As is shown in FIG. 9, the first platform tower 14 is divided vertically into two levels with a partition member, and the surfaces on the −Y side and the +X side are open. And, into an opening 14c on the upper side of the surface on the +X side, a reticle port unit 15 that has a reticle port 15a is inserted (refer to FIGS. 1 and 15). Further, into an opening 14d on the lower side of the surface on the +X side, an electric substrate rack 19 is inserted (refer to FIGS. 1 and 15). Further, into the space on the −X side of reticle port unit 15, a reticle loader unit 21 is inserted from an opening 14e on the upper side on the −Y side, and into the space on the −X side of electric substrate rack 19, a wafer loader unit 23 is inserted from an opening 14f on the lower side on the −Y side (refer to FIG. 15).

As is shown in FIG. 9, the second platform tower 16 is equipped with a first housing 16a and a second housing 16b that have a narrow rectangular parallelepiped shape in the vertical direction, placed a predetermined distance apart in the X-axis direction. The −Y side of the first and second housings 16a and 16b is joined with a plate shaped joint section, except for a part of the upper end section. On the edge surface on the −Y side of the second platform tower 16 facing the first guide bar 14a and the second guide bar 14b, a third guide bar 17a and a fourth guide bar 17b are arranged in a projected manner extending in the X-axis direction, respectively.

The first housing 16a is a frame member that has a hollow inside, and in the hollow inside section, an air conditioner (temperature adjuster) 25 that has a cooler, a heater, an air distributor and the like is inserted.

As is shown in FIG. 1, exposure main section 18 includes a reticle stage module 24 including a reticle stage that holds a reticle (a mask) on which a predetermined pattern is formed, a projection optical system module 26 including a projection optical system PL that projects an image of the pattern, and a wafer stage module 28 including a wafer stage WST that moves holding a wafer W.

Reticle stage module 24 is supported from below on both ends in the Y-axis direction by the first guide bar 14a and the third guide bar 17a.

Figure 2:
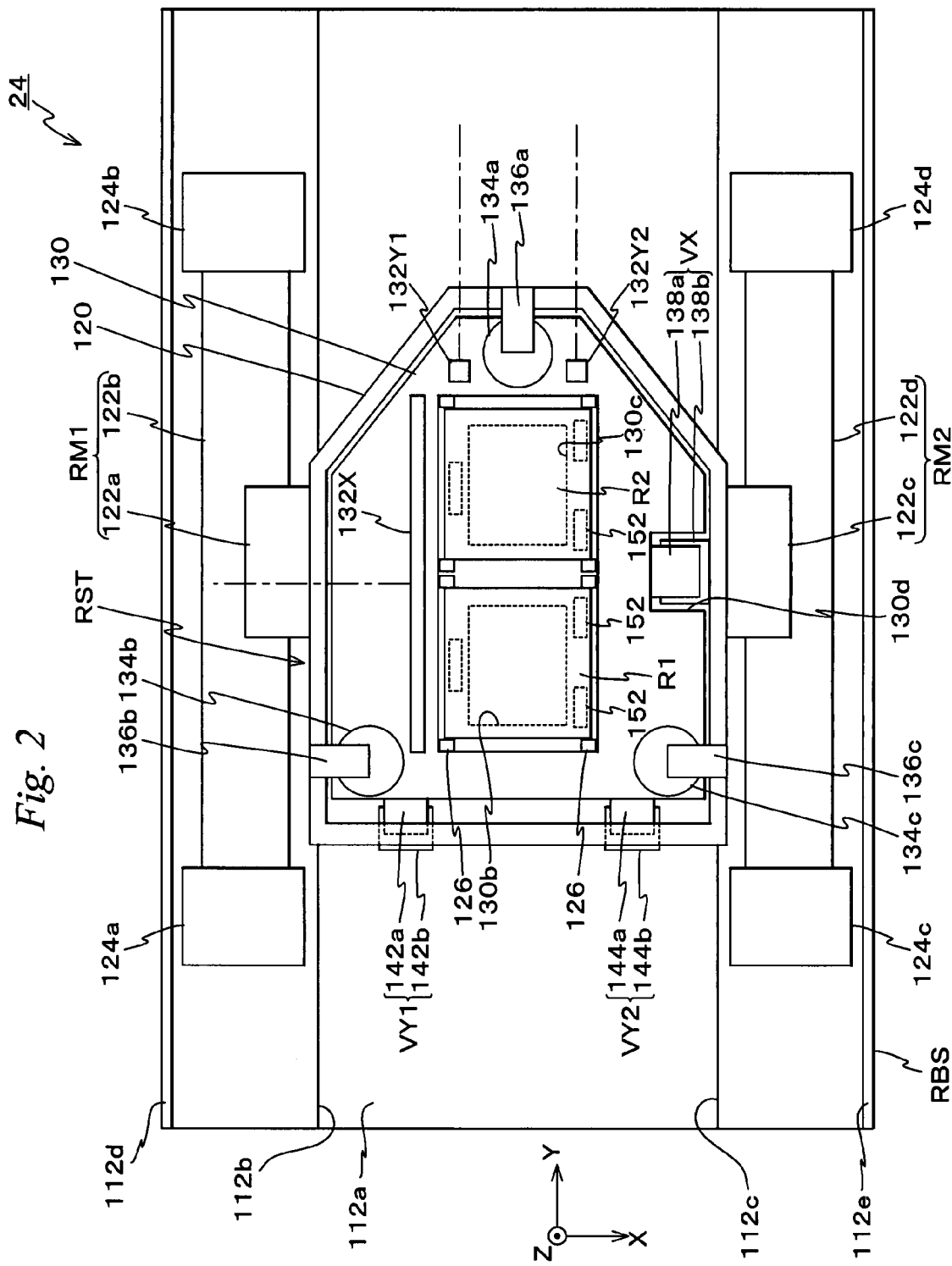
FIG. 2 is a planar view that shows an example of a configuration of a reticle stage module in FIG. 1.

FIG. 2 shows an example of a configuration of reticle stage module 24 in a planar view. As is shown in FIG. 2, reticle stage module 24 is equipped with components such as a platform RBS that has a rectangular shape in a planar view (when viewed from above), a reticle stage RST that moves along a guide surface formed on the upper surface of platform RBS, a reticle stage drive system that includes a pair of Y-axis linear motors RM1 and RM2 and the like.

Platform RBS is made of a three-dimensional plate shaped member that is symmetric to a YZ plane. To be more specific, platform RBS has a step section 112b and a step section 112c on both ends of a center guide surface 112a in the X-axis direction, and the edge section of each of the step sections on the outer side is a side wall 112d and a side wall 112e that has a predetermined height. When viewed from the +X side (or the −X side), platform RBS (and reticle stage module 24) looks like a rectangle whose longitudinal direction is in the Y-axis direction, having a partition line that extends in the horizontal direction at the center in the height direction (refer to FIG. 1). The degree of flatness of the upper surface of step sections 112b and 112c and guide surface 112a is set extremely high.

Above 112b, a Y-axis stator (the stator of Y-axis linear motor RM1) 122b is placed that has a plate shape whose longitudinal direction is in the Y-axis direction, and above 112c, a Y-axis stator (the stator of Y-axis linear motor RM2) 122d is placed that has a plate shape whose longitudinal direction is in the Y-axis direction.

Y-axis stator 122b consists of an armature unit that has a plurality of armature coils placed at a predetermined distance in the Y-axis direction, and to the edge section on both sides in the longitudinal direction, weight members 124a and 124b of a rectangular solid shape are fixed, respectively. On the bottom surface of weight members 124a and 124b, vacuum preload gas statistic bearings (not shown) are arranged, respectively, so as to support Y-axis stator 122b (and weight members 124a and 124b) in a non-contact manner with respect to the upper surface of platform RBS.

Y-axis stator 122d consists of an armature unit that has a configuration similar to Y-axis stator 122b, and to the edge section on both sides in the longitudinal direction, rectangular solid shaped weight members 124c and 124d are fixed, respectively. On the bottom surface of weight members 124c and 124*d*, vacuum preload gas statistic bearings (not shown) are arranged, respectively, so as to support Y-axis stator 122*d* (and weight members 124*c* and 124*d*) in a non-contact manner with respect to the upper surface of platform RBS.

Y-axis stator 122*b* (and weight members 124*a* and 124*b*) and Y-axis stator 122*d* (and weight members 124*c* and 124*d*) perform free motion according to the law of conservation of momentum, by receiving a force in the horizontal direction (mainly the force in the Y-axis direction). A trim motor can be arranged for adjusting the position of Y-axis stators 122*b* and 122*d*.

Reticle stage RST is equipped with a reticle coarse movement stage 120 and a reticle fine movement stage 130, which is supported by suspension from reticle coarse movement stage 120 in a manner that will be described later in the description.

Figure 3:
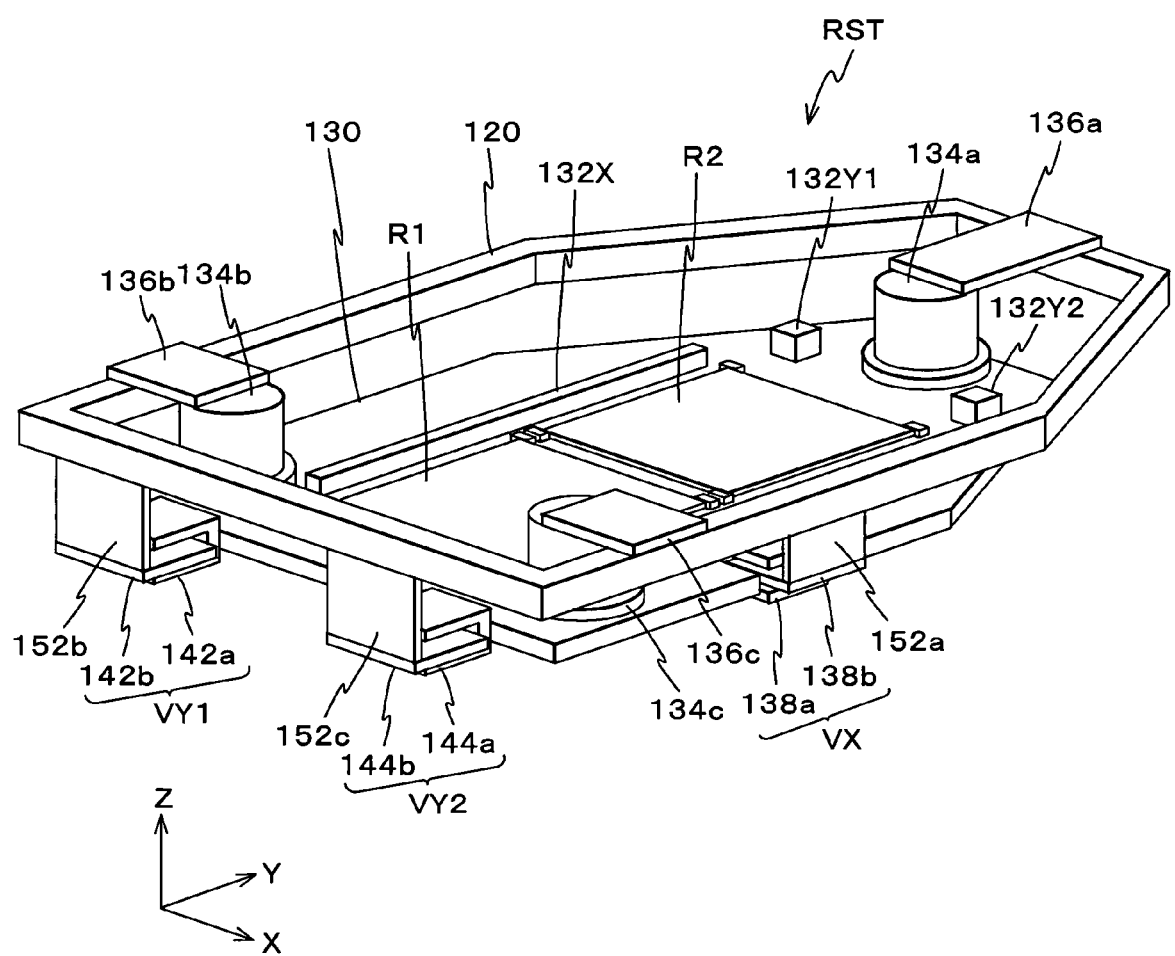
FIG. 3 is a perspective view that shows the reticle stage in FIG. 2 which is extracted.

As it can be seen when viewing the planar view in FIG. 2 and the perspective view in FIG. 3 together, reticle coarse movement stage 120 consists of a hexagonal frame shaped member, which is symmetric to the YZ plane. As is shown in FIG. 2, on both sides of reticle coarse movement stage 120 in the X-axis direction, movers 122*a* and 122*c* consisting of magnetic pole units that have a sectional shape that resembles the letter U and constitute linear motors RM1 and RM2 of a moving type along with Y-axis stators 122*b* and 122*d* are fixed, respectively.

Further, on the upper surface (the surface on the +Z side) of reticle coarse movement stage 120 at the edge section on the +Y side at the center position in the X-axis direction, and at the positions in the vicinity of the edge sections on the −Y side on the edge sections on both sides in the X-axis direction at the position of each vertex in an isosceles triangle, plate shaped members 136*a*, 136*b*, and 136*c* are fixed, respectively. On the lower surface of the free edge section of plate shaped members 136*a*, 136*b*, and 136*c*, the upper edge surface of Z-axis support mechanisms 134*a*, 134*b*, and 134*c* are fixed, as is shown in FIG. 3. Z-axis support mechanisms 134*a* to 134*c* support reticle fine movement stage 130 by suspension. Details of the configuration or the like of Z-axis support mechanisms 134*a* to 134*c* will be described later in the description.

Furthermore, at three places (one place on the +X side and two places on the −Y side) on the lower surface (the surface on the −Z side) of reticle coarse movement stage 120, the upper edge of plate shaped members 152*a*, 152*b*, and 152*c* are fixed, as is shown in FIG. 3. On the lower edge of plate shaped members 152*a* to 152*c*, stators 138*b*, 142*b*, and 144*b* of voice coil motors VX, VY1 and VY2 are respectively fixed.

As is shown in FIG. 2, reticle fine movement stage 130 consists of a plate shaped member that has a hexagonal frame shape slightly smaller than reticle coarse movement stage 120. On the +X side of reticle fine movement stage 130, a rectangular notch section 130*d* is formed, and to the interior of notch section 130*d*, a mover 138*a* that constitutes X-axis voice coil motor VX along with stator 138*b* is fixed. And, in the inside of the notch section, stator 138*b* engages with mover 138*a* in a non-contact manner (refer to FIG. 3).

Further, on the edge surface of reticle fine movement stage 130 on the −Y side, movers 142*a* and 144*a* that constitute Y-axis voice coil motors VY1 and VY2 along with stators 142*b* and 144*b* are fixed.

Reticle fine movement stage 130 is finely moved in the X-axis direction with respect to reticle coarse movement stage 120 by voice coil motor VX, and is also finely moved in the Y-axis direction with respect to reticle coarse movement stage 120 and a rotational direction around the Z-axis (a θz direction) by voice coil motors VY1 and VY2.

As is shown in FIG. 2, on reticle fine movement stage 130, two reticles R1 and R2 are held lined in the Y-axis direction. On the −X side of reticles R1 and R2 on the upper surface of reticle fine movement stage 130, an X-axis movable mirror 132X used for measuring the position of reticle fine movement stage 130 in the X-axis direction is arranged extending in the Y-axis direction. Further, in the vicinity of the edge section on the +Y side on the upper surface of reticle fine movement stage 130, a pair of Y-axis movable mirrors (configured of, for example, retroreflectors or the like) 132Y1 and 132Y2 used for measuring the position of reticle fine movement stage 130 in the Y-axis direction is arranged. On X-axis movable mirror 132X and Y-axis movable mirrors 132Y1 and 132Y2, measurement beams from a reticle X-axis interferometer (not shown) and a pair of reticle Y-axis interferometers (not shown) fixed to a mini-bridge (to be described later) are respectively irradiated.

As is shown in FIG. 2, reticles R1 and R2 are held by vacuum suction by three reticle holders 152 each, arranged in the vicinity of openings 130*b* and 130*c* formed in the center of reticle fine movement stage 130. Further, on the outside of the four corners of reticles R1 and R2, reticle clamp mechanisms 126 for clamping the reticle from both sides in the Y-axis direction are arranged, respectively.

Figure 4A:
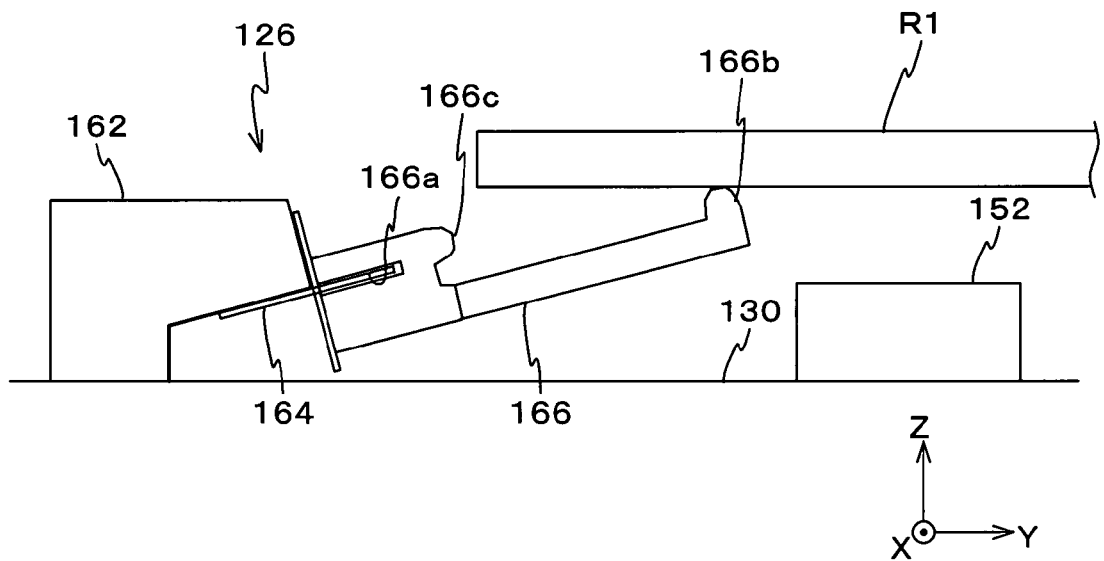
FIG. 4A is a view for describing a configuration of a reticle clamp mechanism.

As is shown in FIG. 4A, each of the reticle clamp mechanisms 126 located on the −Y side of reticle R1 or the +Y side of reticle R2 includes a base section 162 fixed on reticle fine movement stage 130, a cross plate spring 164 arranged on one side (in the example in FIG. 4A, on the +Y side) of the edge section of base section 162 in the Y-axis direction, and a self-clamp member 166 held by cross plate spring 164 in an engaged state.

In self-clamp member 166, a groove 166*a* having a predetermined depth is made on the edge surface on the side that faces base section 162, and into 166*a*, a part of the cross plate spring 164 is inserted. Further, in self-clamp member 166, on the upper surface of the tip section in the longitudinal direction, a protruding section 166*b* is formed, and on the tip side in the section where groove 166*a* is formed, a protruding section 166*c* is also formed.

Further, each of the reticle clamp mechanisms 126 located on the +Y side of reticle R1 or the −Y side of reticle R2 is basically configured in a similar manner as the reticle clamp mechanism shown in FIG. 4A, however, on the upper surface of the section in the vicinity of groove 166*a*, a notched groove is formed orthogonal to the longitudinal direction.

Figure 4B:
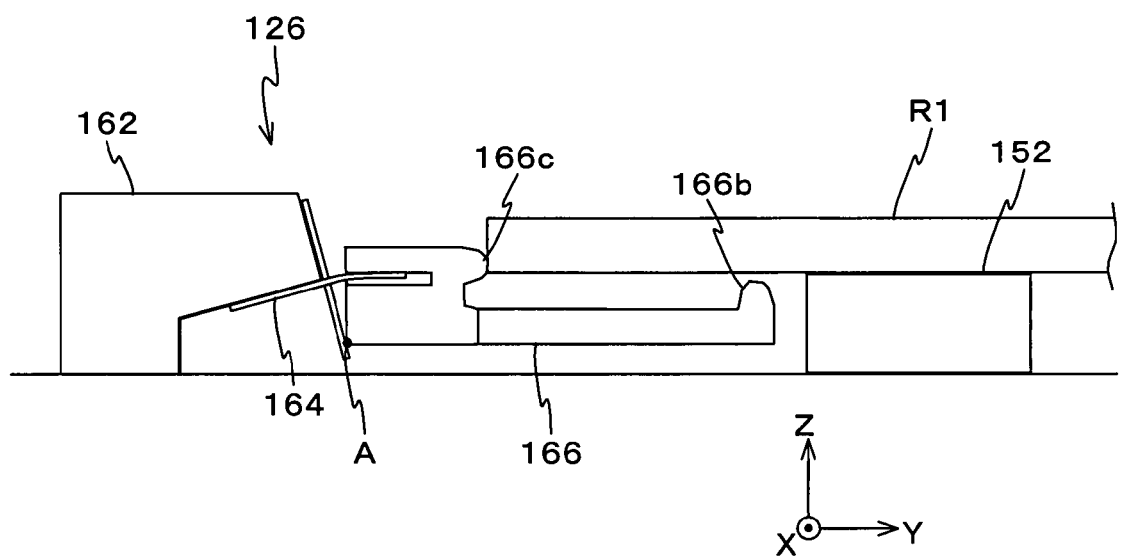
FIG. 4B is a view that shows the reticle clamp mechanism in a state holding a reticle.

Accordingly, as is shown in FIG. 4A, reticle R1 (or R2) carried by a reticle loader (not shown) is mounted on protruding section 166*b* of each of the self-clamp members 166, and when the reticle loader withdraws from below reticle R1 (or R2), each of the self-clamp members 166 rotate with point A and its neighboring area as the center due to the self weight of reticle R1 (or reticle R2) as is shown in FIG. 4B, and reticle R1 (or R2) moves close to each of the reticle holders 152. Then, when vacuum suction of reticle holder 152 begins, reticle R1 (or R2) moves further downward, and reticle R1 (or R2) is held by suction by reticle holder 152. By the above downward movement of reticle R1, self-clamp member 166 works against the elastic force of the cross plate spring and rotates with point A and its neighboring area as the center, and becomes substantially horizontal. In this horizontal state, protruding section 166*c* of each of the self-clamp members 166 is pushed against the edge surface of reticle R1, and by two sets of reticle clamp mechanisms, each set made up of self-clamp members on one side and the other side in the Y-axis direction, reticle R1 (or R2) is clamped and positioned. In this case, in each of the reticle clamp mechanisms 126 located on the +Y side of reticle R1 or the −Y side of reticle R2, since the notched groove orthogonal to the longitudinal direction is formed on the upper surface of the section in the vicinity of groove 166a, protruding section 166c moves in the direction in which the groove width becomes narrower due to the pressing force acting on protruding section 166c so that a compressing force more than necessary does not act on reticles R1 and R2.

Figure 5:
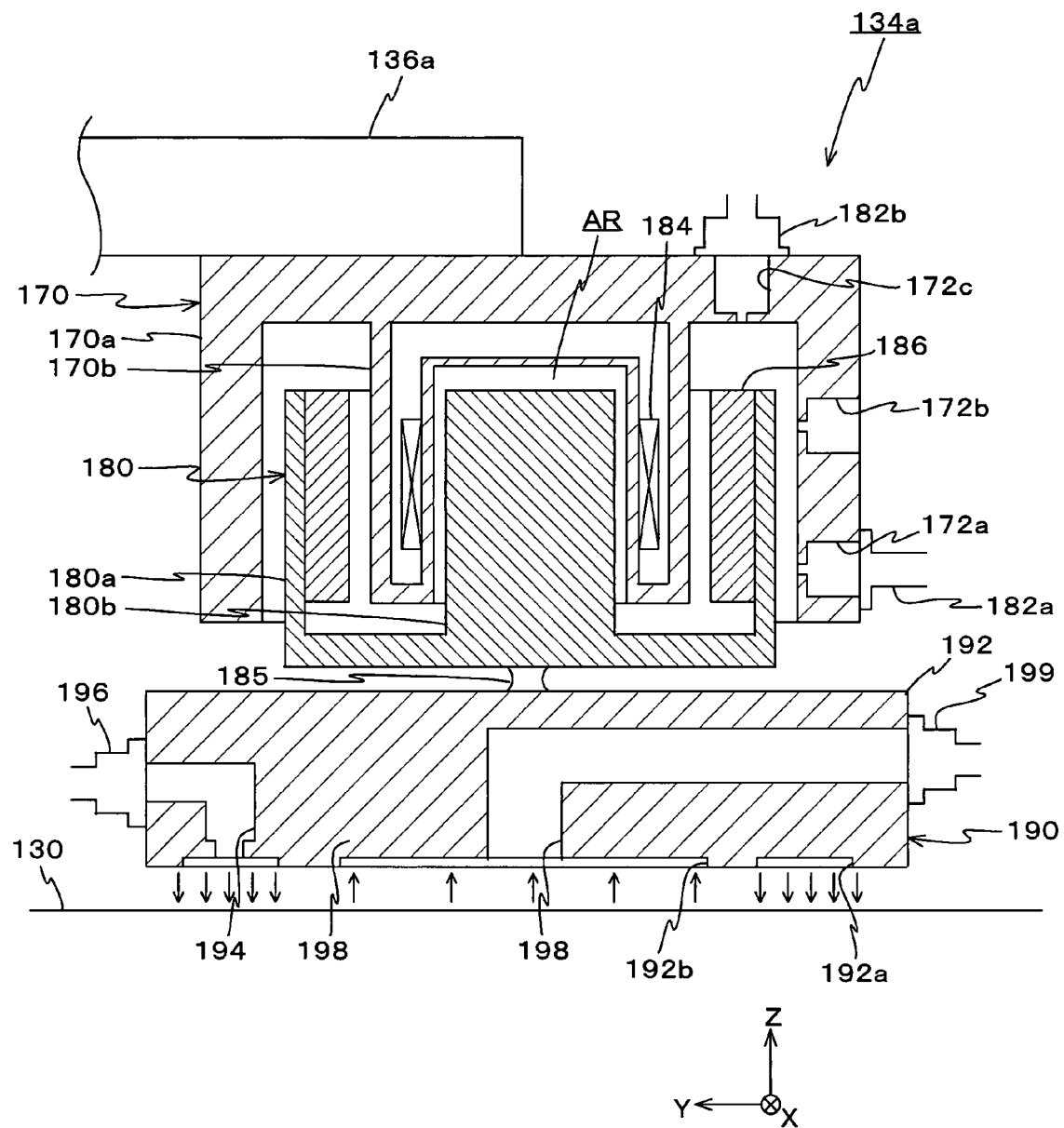
FIG. 5 is an enlarged sectional view that shows a Z-axis support mechanism.

Of Z-axis support mechanisms 134a to 134c, Z-axis support mechanism 134a is picked and an enlarged sectional view is shown in FIG. 5. As is shown in the enlarged sectional view, Z-axis support mechanisms 134a includes a cylinder member 170 of a dual hollow cylindrical shape whose upper end fixed to the lower surface of plate shaped member 136a is closed, a piston member 180 inserted into cylinder member 170 from below that has a cylindrical shape with the lower end closed and a solid cylindrical section in the center, a bearing mechanism 190 connecting to the lower end surface of piston member 180 via a flexure 185 and the like. Cylinder member 170 and piston member 180 are configured relatively movable in the Z-axis direction.

Cylinder member 170 has an outer hollow cylindrical section 170a and an inner hollow cylindrical section 170b that are concentric. The outer diameter of outer hollow cylindrical section 170a is a first diameter, and the outer diameter of inner hollow cylindrical section 170b is a second diameter (<the first diameter). On the side surface of outer hollow cylindrical section 170a, a pipeline 172a is formed in the vicinity of the lower end section, and above pipeline 172a, an atmosphere releasing section 172b is formed. Further, on the upper surface of cylinder member 170, a pipeline 172c is formed that communicates with the space between outer hollow cylindrical section 170a and inner hollow cylindrical section 170b.

Pressurized air is supplied to pipeline 172a from a gas supply unit (not shown) via gas supply pipe 182a, and a static air bearing (air bearing) is configured between the outer circumferential surface of piston member 180 and cylinder member 170. Further, a vacuum pump (not shown) connects to pipeline 172c via a vacuum suction pipe 182b, and this vacuum pump creates a vacuumed state in a space AR between cylinder member 170 and piston member 180.

The inner section of inner hollow cylindrical section 170b of cylinder member 170 is hollow, and a coil 184 is attached to the outer circumference of the inner wall.

Piston member 180 has an outer hollow cylindrical section 180a and an inner solid cylindrical section 180b that are concentric. The outer diameter of outer hollow cylindrical section 180a is a third diameter (the first diameter>the third diameter>the second diameter), and the outer diameter of inner solid cylindrical section 180b is a fourth diameter (<the second diameter). On the inner wall surface of outer hollow cylindrical section 180a, a permanent magnet 186 is fixed. And, with permanent magnet 186 and coil 184 previously described, a voice coil motor is configured that can finely move cylinder member 170 and piston member 180 relatively in the Z-axis direction.

Bearing mechanism 190 includes a disc shaped member 192. On the bottom surface of this disc shaped member 192, a ring shaped blowout groove 192a is formed along the outer circumference, and also in the center, a circular shaped suction groove 192b is formed. Inside member 192, a gas supply path 194 that communicates with a part of blowout groove 192a and a vacuum suction path 198 that communicates with suction groove 192b are formed.

The pressurized gas that is supplied from an external gas supply unit (not show) via a gas supply pipe 196 and gas supply path 194 blows out from blowout groove 192a toward the upper surface of reticle fine movement stage 130, and the air in the vicinity of suction groove 192b is suctioned by a vacuum pump (not shown) via vacuum suction path 198 and a vacuum suction pipe 199. That is, bearing mechanism 190 configures a vacuum preload type statistic gas bearing, and with bearing mechanism 190, reticle fine movement stage 130 is supported by suspension via a predetermined clearance.

According to the three Z-axis support mechanisms 134a to 134c configured in the manner described above, Z-axis support mechanisms 134a to 134c can support reticle fine movement stage 130 in a non-contact manner, and by the air bearing on the inner surface of outer hollow cylindrical section 170a of cylinder member 170, cylinder member 170 and piston member 180 can relatively move vertically in a smooth manner. Further, by atmosphere releasing section 172b, adverse effect on vacuum space AR due to the pressurized air from the air bearing is prevented. Further, bearing mechanism 190 of each of Z-axis support mechanisms 134a to 134c can move freely vertically by the voice coil motor previously described. Therefore, the position and attitude control of reticle fine movement stage 130 can be performed in the Z-axis direction and the gradient direction with respect to the XY plane (the θx direction and the θy direction). Further, because the inside of space AR is vacuum (does not have a spring characteristic), there is no pressure change even if the volume changes, which makes it possible to obtain a favorable vibration blocking characteristic.

Referring back to FIG. 1, projection optical system module 26 includes a mini-bridge 30, a barrel platform 32 supported by suspension from three points from mini-bridge 30 via three connection members, projection optical system PL supported by barrel platform 32, a donut shaped (annular plate shaped) measurement mount 36 supported by suspension from the bottom surface of barrel platform 32 via three cylinder solid rods 34 that are each substantially parallel to the Z-axis and the like. Projection optical system PL is inserted from above into a circular opening in the center of barrel platform 32, and is supported by barrel platform 32 via a flange FLG arranged in the barrel. In this case, as it will be described later, measurement mount 36 is stably connected to barrel platform 32 supported at three points by a kinematic support method. Measurement mount 36 can also be supported by suspension independently from barrel platform 32.

Figure 6:
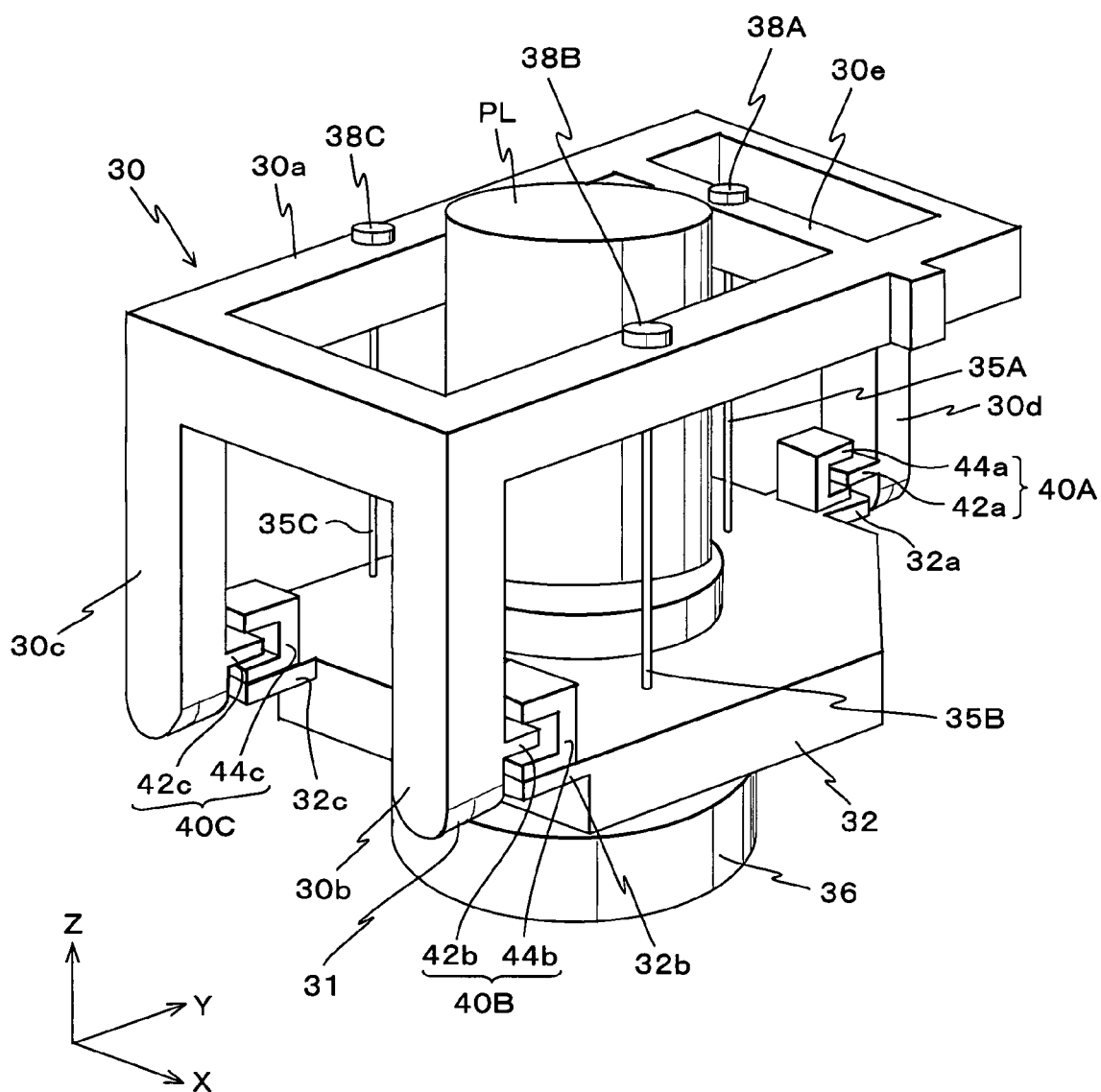
FIG. 6 is a perspective view of a projection optical system module.

As is shown in the perspective view in FIG. 6, mini-bridge 30 is equipped with a rectangular frame section 30a, leg sections 30b and 30c arranged extending downward from the lower surface of frame section 30a in the −Y direction, from the two corner sections on the edge of both ends in the X-axis direction, and a leg section 30d arranged extending downward from the lower surface of frame section 30a in the +Y direction, from the center of the X-axis direction. On each of the lower end section of leg sections 30b, 30c, and 30d, a roller guide 31 is arranged.

Further, at a position a predetermined distance apart to the −Y side from the edge section on the +Y side, a connection section 30e is arranged whose longitudinal direction is in the X-axis direction and connects the two sides of frame section 30a on the −X side and the +X side.

And, into three points (places corresponding to each vertex of an equilateral triangle that is substantially circumscribed to the barrel of projection optical system PL in a planar view (when viewed from above)) of frame section 30a of mini-bridge 30, Z vibration isolation pads 38A, 38B, and 38C of the same passive type are embedded, respectively. Z vibration isolation pads 38A, 38B, and 38C each include an air damper or a coil spring. Z vibration isolation pad 38A is embedded into connection section 30e at the center position in the longitudinal direction, and Z vibration isolation pads 38B and 38C are embedded into the two sides of frame section 30a on the −X side and the +X side at positions where the distance from Z vibration isolation pad 38A is the same.

To the lower end of Z vibration isolation pads 38A, 38B, and 38C, barrel platform 32 is connected via identical wires 35A, 35B, and 35C made of steel. Wire 35A and Z vibration isolation pad 38A correspond to one of the connection members described earlier, and similarly, the other wires 35B and 35C and Z vibration isolation pads 38B and 38C correspond to the remaining two connection members. The connection members are substantially parallel with each other and also are parallel to the Z-axis. In the embodiment, the direction parallel with the Z-axis toward the floor surface (the −Z direction) is the vertical direction, and the plane perpendicular to the Z-axis (the XY plane) is a substantially horizontal plane. Accordingly, from mini-bridge 30 positioned at the +Z direction (above) of barrel platform 32, barrel platform 32 and projection optical system PL are supported by suspension via the three connection members.

In this case, the optical axis of projection optical system PL is parallel to the Z-axis, and the natural vibration frequency of the connection members of the embodiment is lower in the direction perpendicular to the optical axis than the direction parallel to the optical axis of projection optical system PL. The connection members vibrate like a pendulum in the direction perpendicular to the optical axis of projection optical system PL, therefore, when the length of each connection member in the Z-axis direction is expressed as L and the gravitational constant expressed as G (=9.8 m/s$^2$), the natural vibration frequency $f_g$ in the direction perpendicular to the optical axis of projection optical system PL becomes smaller when length L becomes longer, as in the expression below.

$$f_g = (G/L)^{1/2}/(2\pi) \quad (1)$$

The smaller the natural vibration frequency $f_g$ is, the vibration removal capability (the capability of preventing vibration such as floor vibration or the like transmitted from outside mini-bridge 30 from traveling to projection optical system PL) in the direction perpendicular to the optical axis of projection optical system PL improves, therefore, in order to increase the vibration removal capability, length L of the connection member should be longer. Meanwhile, in order to stably support projection optical system PL, barrel platform 32 supported by suspension with the connection members is preferably fixed close to the center of gravity of all the units that are suspended. Further, in order to reduce the size of the exposure apparatus as much as possible, it is preferable for the height of the upper end of mini-bridge 30 to be around the height that does not exceed the upper end of projection optical system PL. From this viewpoint, length L of the connection members becomes around half the length of projection optical system PL in the Z-axis direction or smaller.

As an example, supposing length L of the connection members is set to around 0.5 m. When this value is substituted into equation (1), natural vibration frequency $f_g$ becomes a small value of around 0.7 Hz. Furthermore, in the case length L of the connection members is set to around 1 m or more, from equation (1), natural vibration frequency $f_g$ becomes around 0.5 Hz or under as in the expression below, which is small enough for a projection exposure apparatus.

$$f_g \leq 0.5 \text{ (Hz)} \quad (2)$$

Accordingly, for example, it is preferable to set the length of the connection members from one meter or more to around several meters or less, in the case it is possible according to the length of projection optical system PL.

Further, the natural vibration frequency of wires 35A to 35C in the connection members in the optical axis direction of projection optical system PL becomes much higher than natural vibration frequency $f_g$. However, for example, of the vibration such as floor vibration or the like transmitted from outside mini-bridge 30, because most of the vibration component in the optical axis direction is absorbed by Z vibration isolation pads 38A to 38C (vibration isolation section), a high vibration removal capability can be obtained also in the direction parallel to the optical axis.

As is described above, projection optical system PL and barrel platform 32 that have a rigid structure in the embodiment is supported by suspension with respect to mini-bridge 30 also having a rigid structure via connection members (Z vibration isolation pads 38A to 38C and wires 35A to 35C) with a flexible structure. In this structure, a high vibration removal capability can be obtained and the weight of the mechanical section can be greatly reduced, however, the relative position of projection optical system PL and mini-bridge 30 may change at a relatively low frequency. Therefore, in order to maintain the relative position between projection optical system PL and mini-bridge 30 (and the first platform tower 14, the second platform tower 16 and the like) at a predetermined state, a position setting unit by a non-contact method is arranged, representatively shown as actuators 40A and 40B in FIG. 1.

More particularly, on the surface of leg sections 30d, 30b, and 30c of mini-bridge 30 facing projection optical system PL, stators 42a, 42b, and 42c of voice coil motors 40A, 40B, and 40C are integrally arranged, respectively. On the edge surface of barrel platform 32 on the +Y side, a plate shaped projection section 32a located below stator 42a is integrally arranged, whereas on the edge surface of barrel platform 32 on the −Y side, plate shaped projection sections 32b and 32c located below stators 42b and 42c are integrally arranged. And, on the upper surface of plate shaped projection section 32a, a mover 44a of actuator 40A is fixed, and on the upper surface of plate shaped projection sections 32b and 32c, movers 44b and 44c of actuators 40B and 40C are fixed, respectively.

In this case, in FIG. 6, actuators 40A, 40B, and 40C are each shown as a single voice coil motor, however, each of the actuators 40A and 40B actually include a voice coil motor for drive in the Z-axis direction and a voice coil motor for drive in the X-axis direction (or drive in the Y-axis direction), and actuator 40C includes a voice coil motor for drive in the Z-axis direction and a voice coil motor for drive in the Y-axis direction (or drive in the X-axis direction).

Further, on barrel platform 32 in the vicinity of plate shaped projection sections 32a and 32b, a first two-axis acceleration sensor and a second two-axis acceleration sensor (none shown) are arranged, for detecting the acceleration of barrel platform 32 in the Z-axis direction and the X-axis direction (or the Y-axis direction). Further, on barrel platform 32 in the vicinity of plate shaped projection section 32c, a third two-axis acceleration sensor (not shown) is arranged, for detecting the acceleration of barrel platform 32 in the Z-axis direction and the Y-axis direction (or the X-axis direction). The acceleration information of the two axes detected by each of the first, second, and third accelerator sensors are supplied to a control system (not shown), and the control system drives actuators 40A, 40B, and 40C based on the acceleration information so that barrel platform 32 is relatively static with respect to the earth.

As the above acceleration sensors, for example, a piezoelectric type acceleration sensor that detects the voltage generated in a piezoelectric element (piezo element), or for example, a semiconductor type acceleration sensor that uses the change in logical threshold voltage of a CMOS converter according to the magnitude of distortion or the like can be used. Further, in order to always keep a constant position with respect to the frame, a position sensor of a non-contact method can also be arranged for directly measuring the relative position between barrel platform 32 and leg sections 30b to 30d (and consequently, frame section 30a). As the position sensor, for example, an eddy current displacement sensor, a capacitance displacement sensor, or an optical sensor or the like can be used.

As is described above, the position setting unit of projection optical system PL and barrel platform 32 is configured including the six-axis acceleration sensors, six-axis actuators 40A to 40C, and the control system. More specifically, to vibration of relatively high frequency, the acceleration sensors and the actuators can suppress the effects of the vibration. To vibration of low frequency that does not affect the exposure, the position sensor previously described can be arranged and projection optical system PL can be made to follow the frame.

According to the position setting unit, the relative position of projection optical system PL with respect to mini-bridge 30 in the X-axis direction, the Y-axis direction and the Z-axis direction, and the relative rotational angle around the X-axis, the Y-axis, and the Z-axis are maintained at a constant state (a predetermined state). The response frequency of actuators 40A to 40C of the embodiment is around 10 Hz to 30 Hz, and to vibration up to the response frequency, projection optical system PL is supported by an active suspension method. And, to vibration that exceeds the response frequency, projection optical system PL is supported by suspension according to a passive vibration isolation structure.

As projection optical system PL, for instance, a dioptric system is used that has a projection magnification of 1/4, 1/5 times or the like, numerical aperture NA on the image side that is 0.7, and field diameter of around 27 to 30 mm.

On the bottom surface of barrel platform 32, measurement mount 36 is stably connected by a kinematic support method (refer to FIG. 1) via three rods 34 (the rod in the depth of the page surface is not shown) as is previously described. On measurement mount 36, a wafer alignment system, a focal point position detection system (focus detection system), a laser interferometer system and the like (none are shown) are fixed.

On both ends (vertical ends) in the longitudinal direction of each of the rods 34, a flexure section is formed that has a narrow diameter. In this case, at the flexure section on the vertical ends of each of the rods 34, displacement in 5 degrees of freedom is possible except for the Z-axis direction. Therefore, there is hardly any stress acting between barrel platform 32 and measurement mount 36. Accordingly, high measurement accuracy can be obtained due to the laser interferometer system or the like fixed on measurement mount 36. Furthermore, although it is omitted in the drawings, at three places in the vicinity of the opening in which projection optical system PL is inserted in the center of measurement mount 36, notch sections and projected sections are formed, and the three projected sections are in contact with the side surface of projection optical system PL. In this case, displacement of the projected section is possible in 5 degrees of freedom, including displacement in a radial direction with the optical axis serving as the center with respect to the side surface of projection optical system PL and the Z-axis direction, and displacement in a rotational direction around the Z-axis, X-axis and Y-axis (the θz direction, the θx direction, and the θy direction). Accordingly, there is hardly any stress acting also between measurement mount 36 and projection optical system PL, therefore, the image-forming characteristics of projection optical system PL can be maintained in a stable manner.

As is shown briefly in FIG. 1, wafer stage module 28 includes a wafer base 52 installed on base plate 12, wafer stage WST that moves on wafer base 52 and the like.

Figure 7:
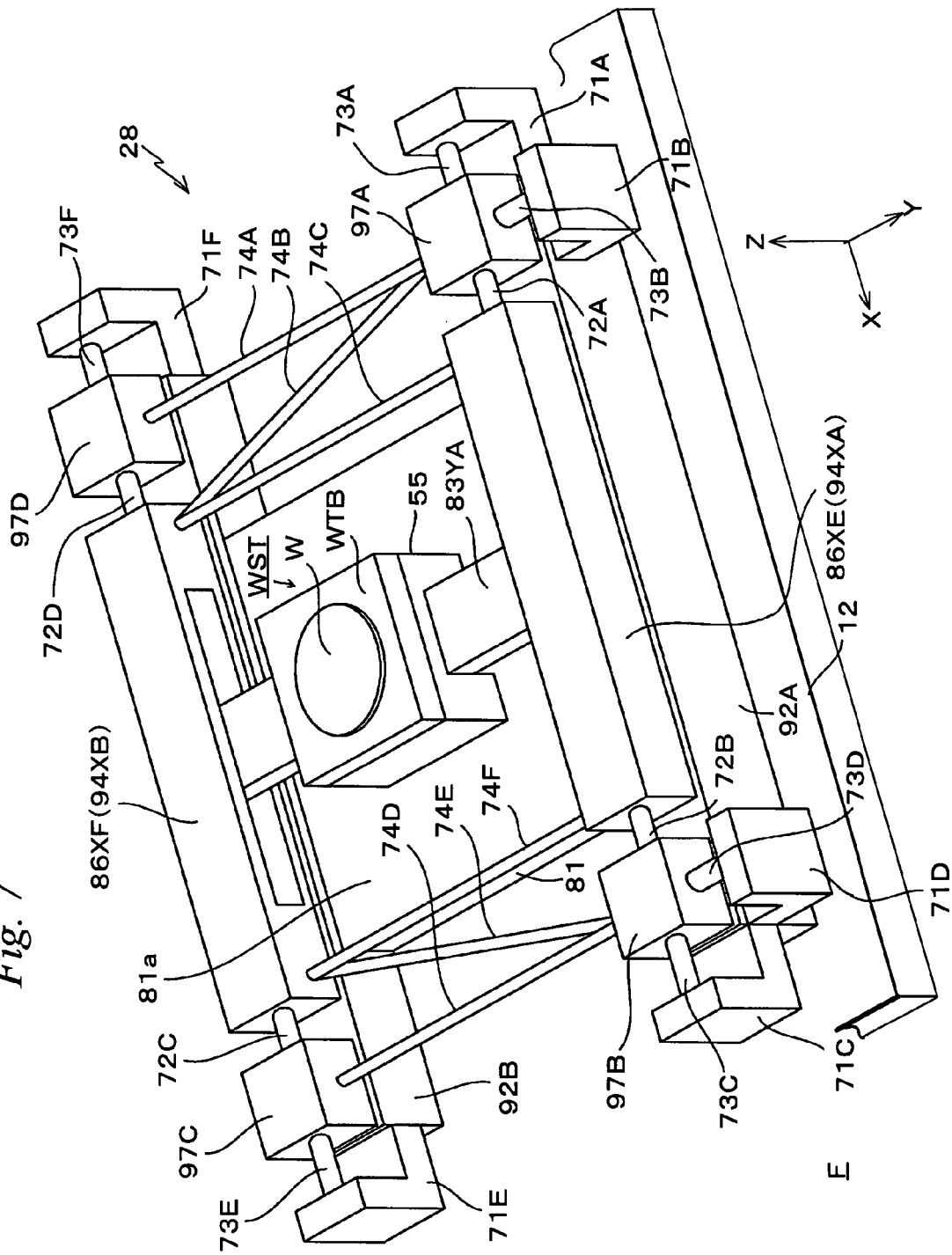
FIG. 7 is a perspective view of an example of a wafer stage module.

FIG. 7 shows a perspective view of an example of a configuration of wafer stage module 28.

In FIG. 7, on base plate 12 installed on floor surface F, base members 92A and 92B are installed on both sides of the Y-axis direction with a wafer stage platform 81 in between. Wafer stage platform 81 and base members 92A and 92B constitute wafer base 52 in FIG. 1. Wafer stage platform 81 and base members 92A and 92B can be integrally formed.

Above a guide surface 81a, which is the upper surface of wafer stage platform 81, a Y-axis guide 83YA equipped with a stator of a Y linear motor is placed substantially parallel to the Y-axis, and a Z leveling mechanism 55 is arranged freely movable in the Y-axis direction along Y-axis guide 83YA. On Z leveling mechanism 55, a wafer table WTB for holding wafer W is fixed. Wafer table WTB and Z leveling mechanism 55 constitute wafer stage WST. Z leveling mechanism 55 can move smoothly on guide surface 81a via an air bearing (not shown). Further, Z leveling mechanism 55 is equipped with a mechanism for controlling the position of wafer table WTB in the Z-axis direction and the rotational angle (gradient angle) around the X-axis and Y-axis, and a mover of the Y linear motor for driving Z leveling mechanism 55 in the Y-axis direction along Y-axis guide 83YA. In the description below, for the sake of convenience, the Y linear motor will also be defined as Y linear motor 83YA, using the same reference numeral as the Y-axis guide in which the stator is equipped.

As the above mechanism that controls the position of wafer table WTB in the Z-axis direction and the rotational angle (gradient angle) around the X-axis and Y-axis, for example, Z leveling mechanism 55 is equipped with three Z-axis support mechanisms (not shown) that have a configuration similar to Z-axis support mechanisms 134a to 134c previously described. However, in the Z-axis support mechanisms equipped in Z leveling mechanism 55, vacuum preload air bearings are arranged not only on the lower end side of the piston members but also on the upper end side of the cylinder members.

In parallel with the X-axis and also freely movable in the X-axis direction along a linear guide (not shown) (or a magnet track which is a guide that has a magnet arranged) on base members 92A and 92B, stators 86XE and 86XF of X linear motors are placed, and the movers (not shown) on the edge section of Y-axis guide 83YA and stators 86XE and 86XF constitute X linear motors 94XA and 94XB for driving Y-axis guide 83YA and wafer stage WST in the X-axis direction. Further, the two stators 86XE and 86XF are connected by two rods 74C and 74F, which are substantially parallel to the Y-axis, at both ends in the X-axis direction. Accordingly, when driving X linear motors 94XA and 94XB, the two stators 86XE and 86XF move relatively according to the reaction force, which makes it possible to prevent only one of the stators 86XE and 86XF from moving greatly.

Further, on one side and the other side of the moving direction (the X-axis direction) with stator 86XE in between, two damper members 97A and 97B are arranged, respectively, and on one side and the other side of the moving direction (the X-axis direction) with stator 86XF in between, two damper members 97C and 97D are arranged. The mass of damper members 97A and 97B together (M2) is set smaller than the mass of stator 86XE (M1), and the mass of damper members 97C and 97D together (M2) is also set smaller than the mass of stator 86XF (M1). Damper members 97A to 97D are mounted on base members 92A or 92B, for example, via air bearings. Accordingly, damper members 97A to 97D can each move smoothly in the X-axis direction and the Y-axis direction. Furthermore, the two damper members 97B and 97C in the +X direction are connected by rod 74D, which is substantially parallel to the Y-axis, and the two damper members 97A and 97D in the −X direction are connected by rod 74A, which is substantially parallel to the Y-axis. Accordingly, the two damper members 97A and 97D and the two damper members 97B and 97C each move relatively, which can prevent the displacement amount of only one of the damper members 97A to 97D from being large.

Further, stator 86XF and damper member 97A are connected by a mechanical filter member 74B, and stator 86XF and damper member 97B are connected by a mechanical filter member 74E. Mechanical filter members 74B and 74E (and a mechanical filter member that will be described later) are members, for example, that can expand/contract in the longitudinal direction and include a coil spring in a part of its structure, and mechanical filter members 74B and 74E function as a low-pass filter for vibration. This allows the vibration of stator 86XF (and stator 86XE) to be suppressed even more.

Further, on the side surface of base member 92A, frame members 71A and 71B are fixed facing damper member 97A, and on the side surface of base member 92A, frame members 71C and 71D are fixed facing damper member 97B. Similarly, on the side surface of base member 92B, frame members 71E and 71F are fixed facing damper members 97C and 97D, respectively. Further, stator 86XE and damper members 97A and 97B are connected via mechanical filter members 72A and 72B, respectively, damper member 97A and frame members 71A and 71B are connected via mechanical filter members 73A and 73B, respectively, and damper member 97B and frame members 71C and 71D are connected via mechanical filter members 73C and 73D, respectively. Furthermore, stator 86XF and damper members 97C and 97D are connected via mechanical filter members 72C and 72D, respectively, and damper members 97C and 97D and frame members 71E and 71F are connected via mechanical filter members 73E and 73F, respectively.

In the embodiment, when making wafer stage WST move in the X-axis direction with linear motors 94XA and 94XB by driving Y-axis guide 83YA, stators 86XE and 86XF move in the opposite direction by the reaction force. Damper members 97A to 97D move substantially in the same direction due to the movement of stators 86XE and 86XF, and on this movement, for example, vibration of a high frequency component of around 50 Hz or more is attenuated, and a low frequency component under 50 Hz is released to floor surface F through frame members 71A, 71C, 71E, and 71F, base members 92A and 92B, and base plate 12. Further, of the vibration in the Y-axis direction caused by the difference of reaction force between stator 86XE and stator 86XF or the like, the high frequency component is attenuated by damper members 97A to 97D, and the remaining low frequency component is released to floor surface F through frame members 71B and 71D, base member 92A, and base plate 12. Accordingly, the influence of vibration when driving liner motors 94XA and 94XB is reduced.

Referring back to FIG. 1, the illumination optical system that constitutes illumination system ILS consists of a first illumination unit 20 and a second illumination unit 22 that are optically connected, and the first illumination unit 20 and the second illumination unit 22 each have a plurality of optical member arranged at a predetermined positional relation within a housing. The first illumination unit 20, for example, has a variable attenuator for adjusting light amount, a beam shaping optical system that allows the illumination condition of the reticle to be variable, a homogenizing optical system (including an optical integrator system such as a fly-eye lens and a lens system) and the like, and is placed within the space of the first and second housings 16a and 16b of the second platform tower 16.

Although it is not shown in the drawings, the first illumination unit 20 is optically connected to a light source placed within a utility space under the floor via a light transmitting optical system that includes, for example, an optical system for optical axis adjustment (a beam matching unit) in a part of the system. As the light source, in this case, a KrF excimer laser (oscillation wavelength: 248 nm) or an ArF excimer laser (oscillation wavelength: 193 nm) is used.

The second illumination unit 22 has, for example, a beam splitter, a light amount sensor, a reticle blind system, a relay optical system (including a mirror and an image-forming lens system) and the like, and is placed above the second platform tower 16 and reticle stage module 24.

The entering end (the end on the +Y side) of the housing of the second illumination unit 22 is physically fixed on the upper surface of the outgoing end (the end on the +Z side) of the housing of the first illumination unit 20. Further, the housing of the second illumination unit 22 is also supported by reticle stage module 24 via a spacer member.

Accordingly, in exposure apparatus 100, the illumination light (exposure light) from the light source is guided to the illumination optical system by the light transmitting optical system, and the illumination light is irradiated on reticle R1 (or R2) by the illumination optical system with a uniform illuminance distribution, and also on reticle R1 (or R2), an image of the aperture of the reticle blind system is formed. In this case, the irradiation area (illumination area) of the illumination light on reticle R1 (or R2) is set by the reticle blind system, and in the embodiment, the irradiation area will be a shape narrowly extending in the X-axis direction, which is a non-scanning direction.

Of the circuit pattern areas (patterns) formed on reticle R1 (or R2), the image of the area irradiated by the illumination light is projected on wafer W on which a photoresist is coated via projection optical system PL, which is both-side telecentric having a projection magnification β that is a reduction magnification, and a partially reduced image of the circuit pattern is formed on the resist layer.

In exposure apparatus 100 configured in the manner described above, irradiation of the illumination light on reticle R1 (or R2) from illumination system ILS begins, and by the scanning exposure operation in which reticle stage RST and wafer stage WST are synchronously moved (synchronous scanning) in the Y-axis direction, the pattern image of reticles R1 and R2 is transferred onto a shot area on wafer W. In this scanning exposure operation, a control system (not shown) controls the drive of reticle stage RST and wafer stage WST, using the reticle stage drive system (Y-axis liner motors RM1 and RM2, voice coil motors VY1, VY2 (and VX)) and a wafer stage drive system (Y linear motor 83YA and (X linear motors 94XA and 94XB)). Then, the control system stops the irradiation of the illumination light, and repeats a stepping movement operation in which wafer W is stepped in the X-axis direction and/or in the Y-axis direction via wafer stage WST and the above exposure operation. In the manner described above, the pattern image of reticles R1 and R2 is transferred onto a plurality of shot areas on wafer W by the step-and-scan method.

According to exposure apparatus 100 of the embodiment, in one scanning exposure, the pattern image of reticles R1 and R2 is transferred onto the wafer. Therefore, in exposure apparatus 100, throughput can be improved compared to a typical scanning stepper in which the pattern image of a single reticle is transferred in one scanning exposure. In the embodiment, reticles R1 and R2 both had the same pattern, however, the pattern of reticles R1 and R2 can be different, or the so-called multiple exposure in which the pattern image of reticles R1 and R2 is transferred onto the same shot area can also be performed. Further, in one scanning exposure, the pattern image transferred onto the wafer can be the image of only one of reticles R1 and R2.

Next, the making method of exposure apparatus 100 will be described based on FIGS. 8 to 15, focusing on the making process of the exposure apparatus in a clean room in which the temperature, the degree of cleanliness and the like are controlled.

Figure 8:
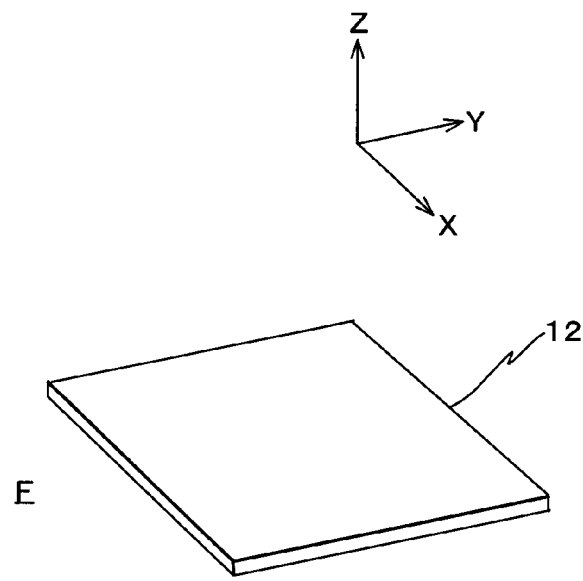
FIG. 8 is a view (No. 1) for describing a making process of the exposure apparatus.

First of all, at a predetermined position on floor surface F of the clean room, base plate 12 is installed as is shown in FIG. 8. In this case, based plate 12 is placed at the predetermined position so that a pair of opposing sides of base plate 12 is parallel to the Y-axis, and the remaining pair of sides is parallel to the X-axis.

Next, as is shown in FIG. 9, the first platform tower 14 and the second platform tower 16 are installed on floor surface F, respectively, so that the first platform tower 14 is adjacent to one side of base plate 12 (the −Y side) in the Y-axis direction and the second platform tower 16 is adjacent to the other side (+Y side).

In this case, in the first platform tower 14, reticle port unit 15 that has a reticle port 15a is to be fitted in advance, and in the first housing 16a of the second platform tower 16, air conditioner 25 is to be fitted in advance.

Figure 10:
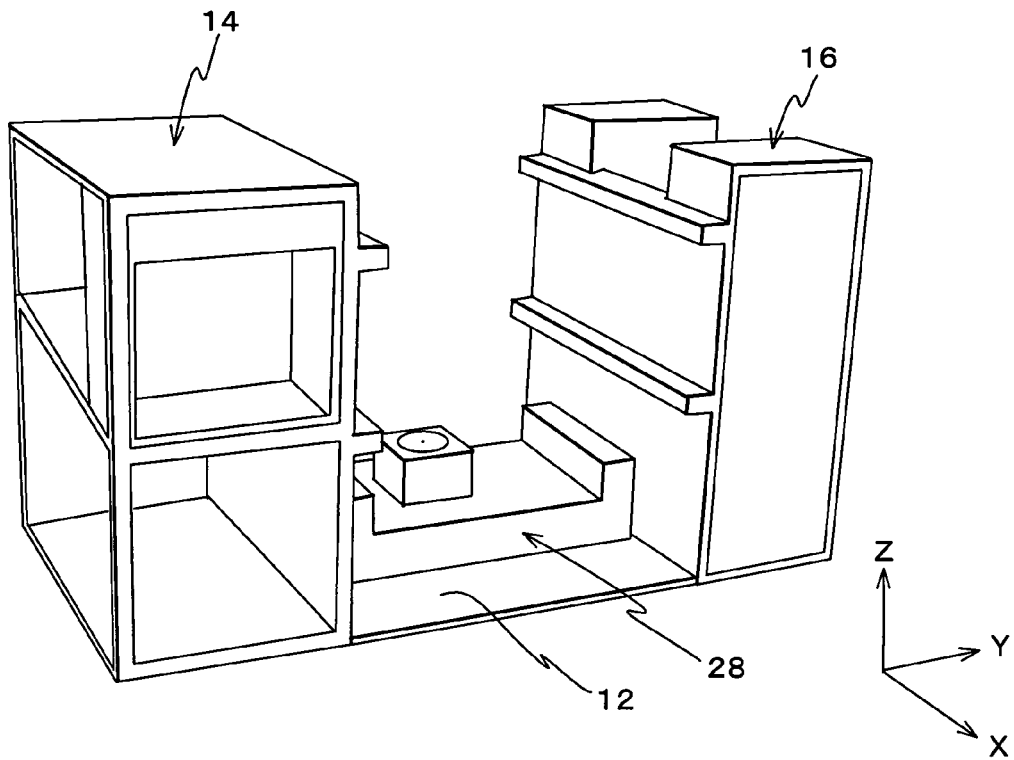
FIG. 10 is a view (No. 3) for describing a making process of the exposure apparatus.

Next, as is shown in FIG. 10, wafer stage module 28 is inserted from the +X side along the upper surface of base plate 12 toward the −X side. Then, when a part of wafer base 52 comes into contact with a stopper (not shown), the position of wafer stage module 28 is set. Incidentally, wafer stage module 28 shown in FIG. 10 is simplified. Prior to the installation on base plate 12, wafer stage module 28 is assembled so as to maintain a predetermined mechanical accuracy and electrical accuracy (and optical accuracy). In order to secure the various accuracies, before and after the assembly, adjustment for achieving the mechanical accuracy for various mechanical systems and adjustment for achieving the electrical accuracy for various electrical systems are performed inside the module. Further, adjustment for achieving the optical accuracy for various optical systems is performed inside the module as necessary. Then, after installation on base plate 12, wiring connection of the electric circuits, piping connection of the pressure circuits and the like are performed as necessary.

Figure 11:
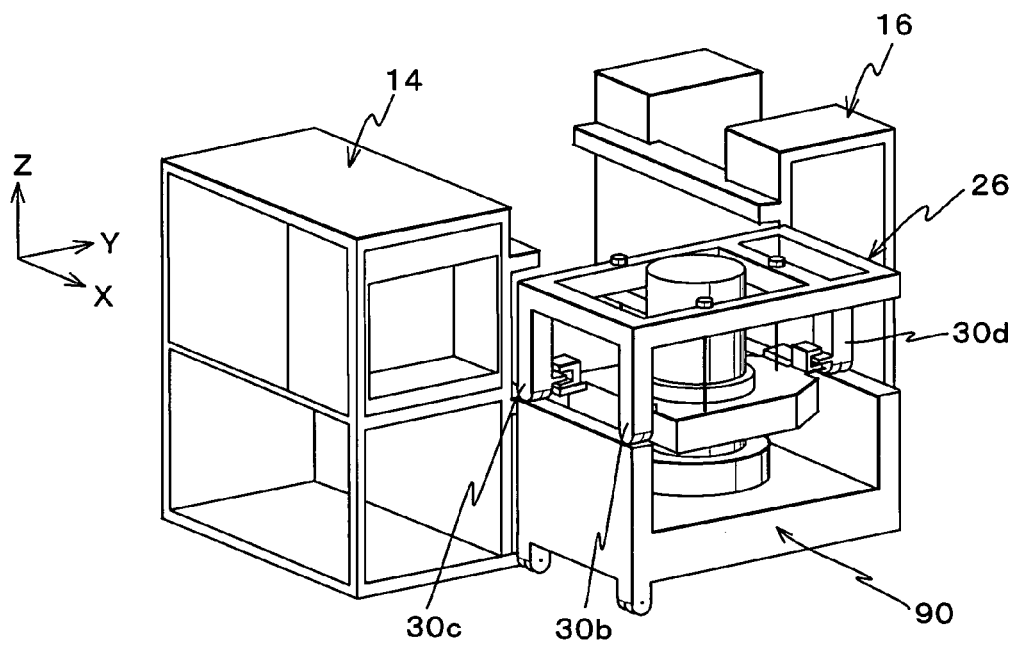
FIG. 11 is a view (No. 4) for describing a making process of the exposure apparatus.

Next, as is shown in FIG. 11, projection optical system module 26 is mounted on a tool carriage 90, and is carried to the front position of base plate 12. In this case, projection optical system module 26 is assembled so as to maintain a predetermined mechanical accuracy, electrical accuracy, and optical accuracy. In order to secure the various accuracies, before and after the assembly, adjustment for achieving the mechanical accuracy for various mechanical systems, adjustment for achieving the electrical accuracy for various electrical systems, and adjustment for achieving the optical accuracy for various optical systems are respectively performed inside the module.

On tool carriage 90, a pair of side walls that have the same height as the second guide bar 14b and the fourth guide bar 17b is arranged, and on the upper surface of the pair of side walls, leg sections 30b, 30c, and leg section 30d are mounted.

Figure 12:
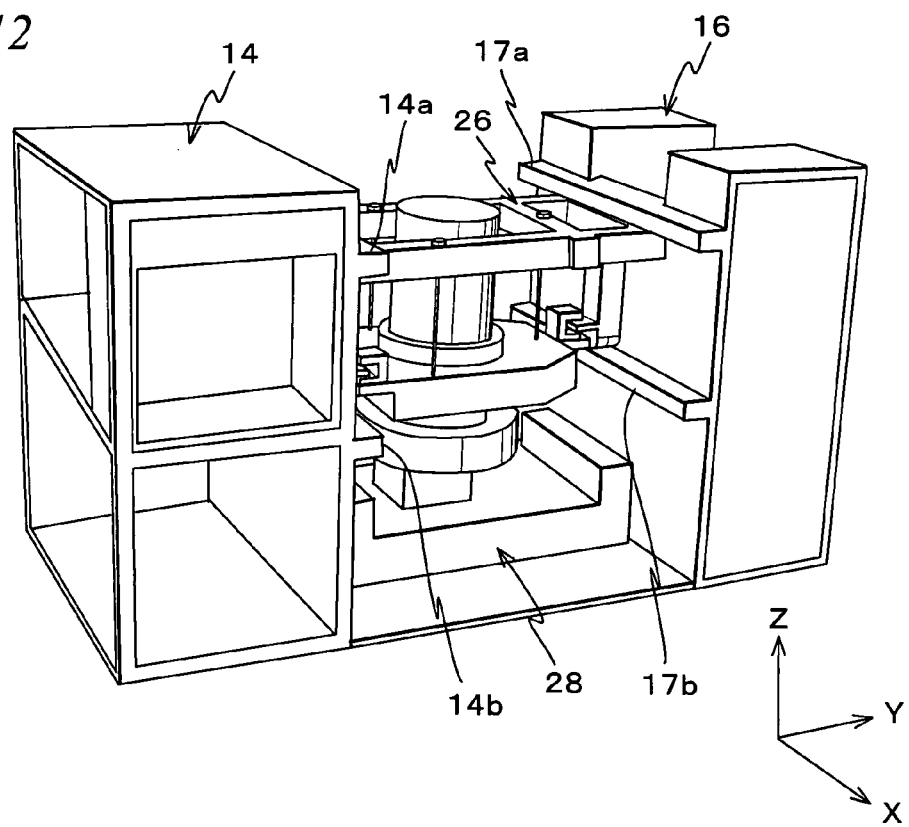
FIG. 12 is a view (No. 5) for describing a making process of the exposure apparatus.

Then, next, projection optical system module 26 is pushed from the +X direction toward the −X direction, and projection optical system module 26 is moved from tool carriage 90 onto the second guide bar 14b and the fourth guide bar 17b via roller guides 31 arranged on the lower end of leg sections 30b, 30c, and 30d. Then, when leg sections 30c and 30d come up against stoppers (not shown), the position of projection optical system module 26 is set. FIG. 12 shows the state immediately after this position setting.

Then, in this position setting state, mini-bridge 30 is fixed to at least one of the first platform tower 14 and the second platform tower 16 using a fixing member (not shown). Then, wiring connection of the electric circuits, piping connection of the pressure circuits and the like are performed as necessary.

Figure 13:
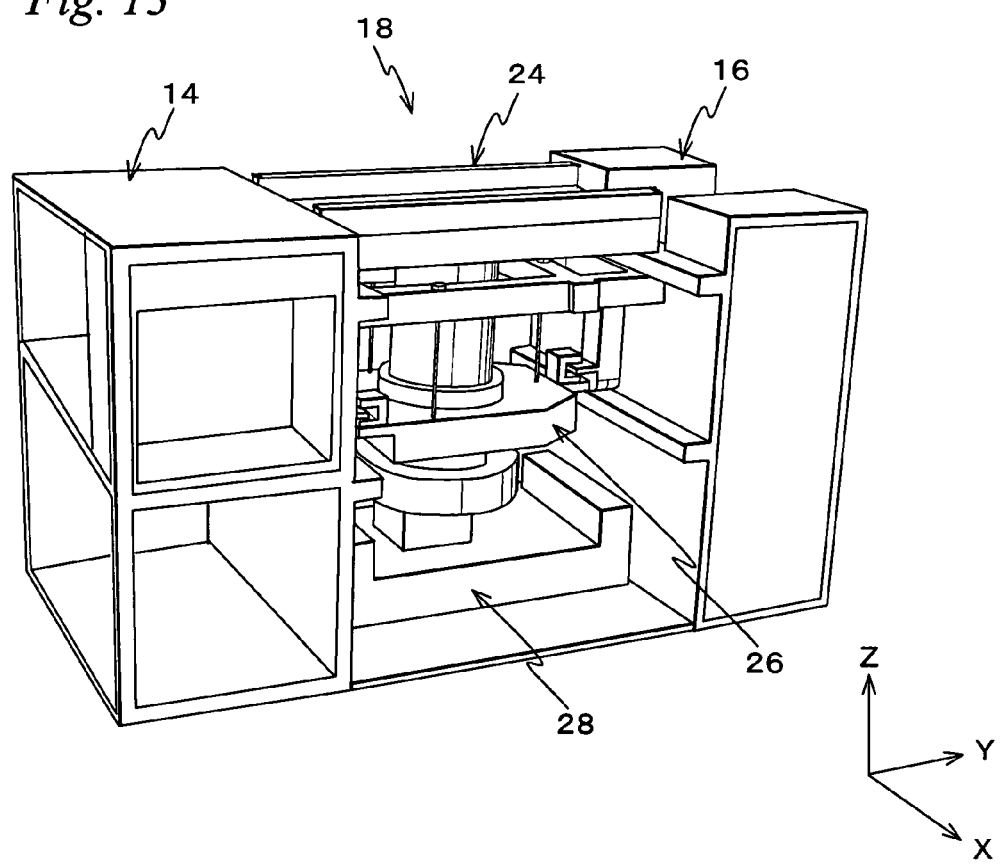
FIG. 13 is a view (No. 6) for describing a making process of the exposure apparatus.

Next, reticle stage module 24 is inserted from the +X side toward the −X side along the upper surface of the first guide bar 14a and the third guide bar 17a previously described. Then, when a part of platform RBS comes up against a stopper (not shown), the position of reticle stage module 24 is set. FIG. 13 shows the state immediately after this position setting.

Then, in this position setting state, platform RBS is fixed to at least one of the first platform tower 14 and the second platform tower 16 using a fixing member (not shown).

Prior to the insertion onto the first guide bar 14a and the third guide bar 17a, reticle stage module 24 is assembled so as to maintain a predetermined mechanical accuracy and electrical accuracy (and optical accuracy). In order to secure the various accuracies, before and after the assembly, adjustment for achieving the mechanical accuracy for various mechanical systems and adjustment for achieving the electrical accuracy for various electrical systems are performed inside the module. Further, adjustment for achieving the optical accuracy for various optical systems is also performed inside the module as necessary. Then, wiring connection of the electric circuits, piping connection of the pressure circuits and the like are performed as necessary.

Figure 14:
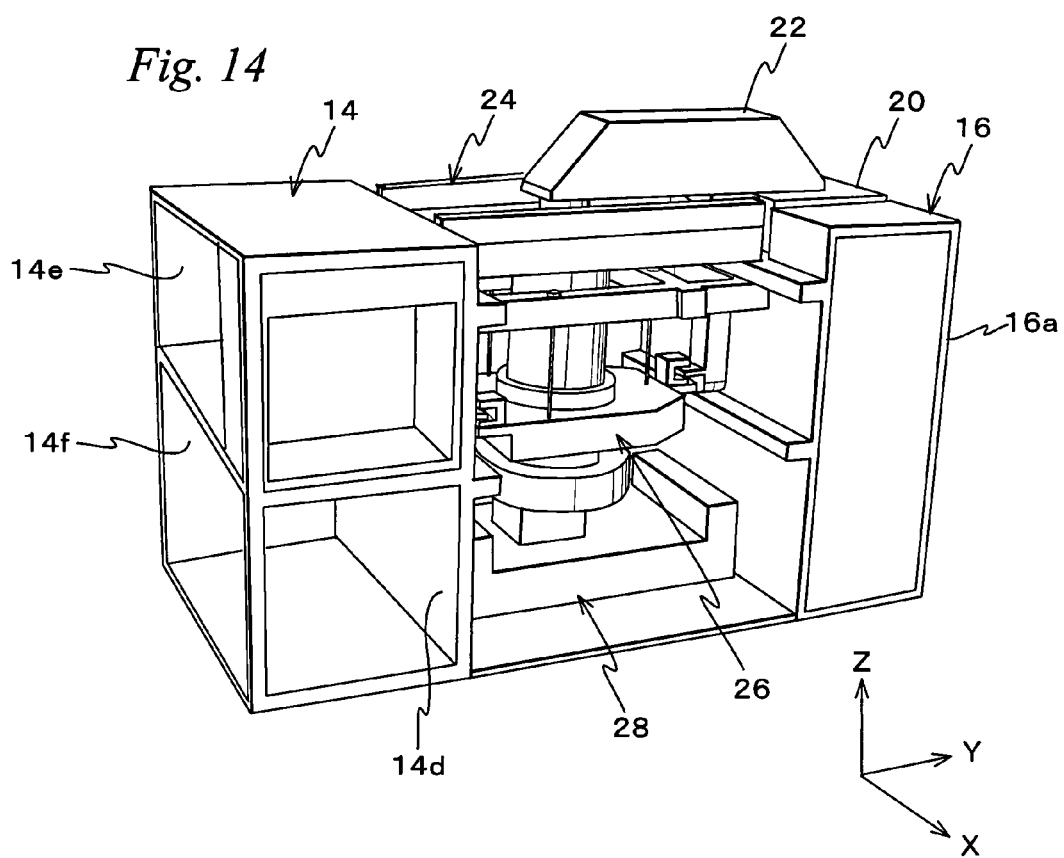
FIG. 14 is a view (No. 7) for describing a making process of the exposure apparatus.

Next, the first illumination unit 20 is inserted into the space between the first housing 16a and the second housing 16b of the second platform tower 16 previously described. Then, continuously, the second illumination unit 22 is installed to its predetermined position above the first housing 16a and reticle stage module 24. Then, optical adjustment (including position adjustment of the optical axis) between the first illumination unit 20 and the light transmitting optical system and optical adjustment between the second illumination unit 22 and the first illumination unit 20 and the like are performed. And then, using fixing members (not shown), the first illumination unit 20 and the second illumination unit 22 are fixed to the second platform tower 16, and the first illumination unit 20 and the second illumination unit 22 are also connected reciprocally. Further, a spacer member is inserted between platform RBS of reticle stage module 24 and the second illumination unit 22. FIG. 14 shows the state immediately after the attachment of the first illumination unit 20 and the second illumination unit 22 has been performed in the manner described above.

Prior to the above attachment, the first illumination unit 20 and the second illumination unit 22 are each assembled so as to maintain a predetermined mechanical accuracy, electrical accuracy, and optical accuracy. In order to secure the various accuracies, before and after the assembly, adjustment for achieving the mechanical accuracy for various mechanical systems, adjustment for achieving the electrical accuracy for various electrical systems, and adjustment for achieving the optical accuracy for various optical systems are respectively performed inside the units. And, after the above attachment, wiring connection and the like of the electric circuits are performed as necessary. The optical adjustment between the light transmitting optical system and the light source has already been performed.

Next, electric substrate rack 19 is inserted into opening 14d of the first platform tower 14, and reticle loader unit 21 and wafer loader unit 23 are also inserted into openings 14e and 14f of the first platform tower 14, respectively, and are fixed to the first platform tower 14 using fixing members (not shown). Then, wiring connection of the electric circuits, piping connection of the pressure circuits and the like that are necessary are performed. Prior to the above attachment, reticle loader unit 21 and wafer loader unit 23 are each assembled so as to maintain mechanical accuracy, electrical accuracy, and optical accuracy.

Figure 15:
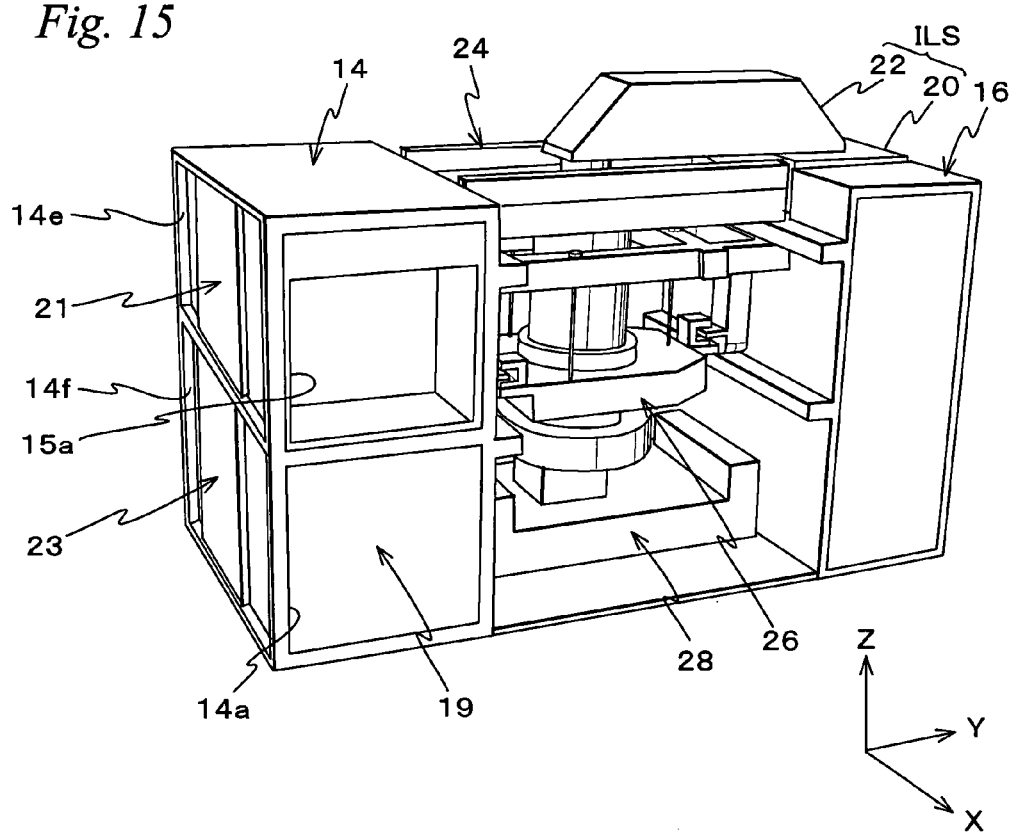
FIG. 15 is a view (No. 8) for describing a making process of the exposure apparatus.

FIG. 15 shows a state in which the assembly operation of the constitutive sections of the first platform tower 14 and the second platform tower 16 and the exposure main section has been completed in the manner described above.

Then, reticle loader unit 21 (a reticle loader chamber), wafer loader unit 23 (a wafer loader chamber), and a space in which exposure main section 18 is housed (an exposure chamber) are connected to air conditioner 25 by a duct (not shown) or the like. On this connection, in the embodiment, the upper section of the exposure chamber is to be covered with the duct. The function and the like of an air conditioning unit (a temperature adjusting unit) including air conditioner 25, the duct and the like will be described later in the description.

When the assembly process of the exposure apparatus made up of the various modules and various units is completed in the manner described above, then, the necessary total adjustment is performed. Accordingly, various accuracies of the entire exposure apparatus are secured.

Finally, by covering both sides of the exposure chamber in the X-axis direction with panels 98 and 99 (refer to FIG. 16), the making of exposure apparatus 100 that has an exposure chamber of a substantially air tight state is completed.

Figure 16:
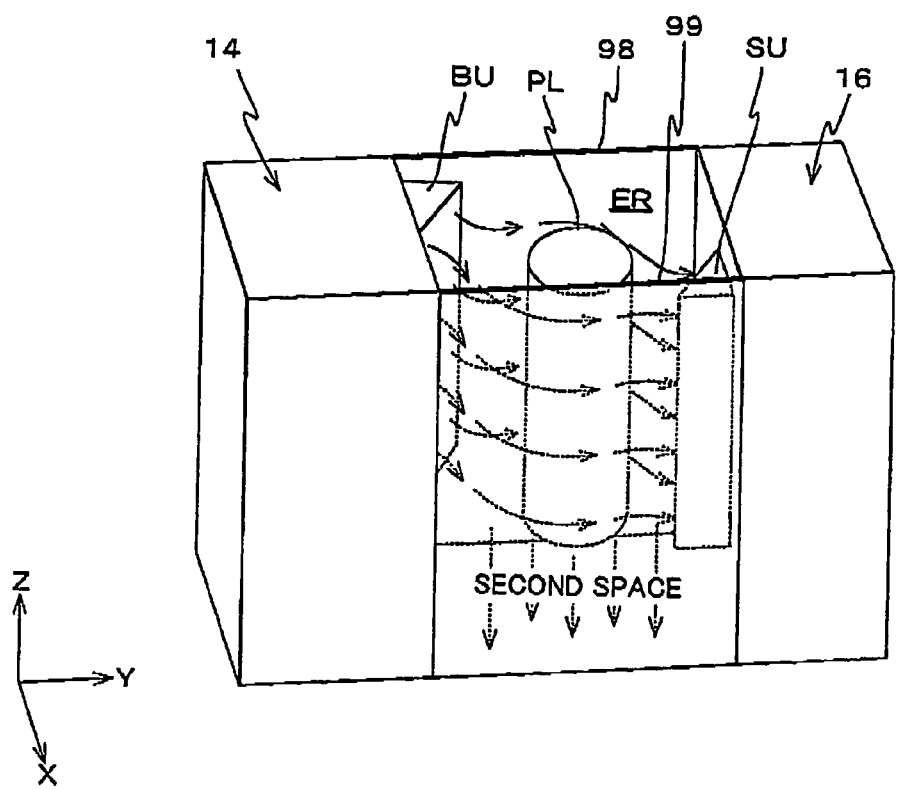
FIG. 16 is a view for describing an air conditioning of a space enclosed by a first platform tower, a second platform tower, and two panels 98 and 99 of the exposure apparatus.

FIG. 16 shows a schematic view of the first platform tower 14, the second platform tower 16, panels 98 and 99, and a rectangular space (hereinafter referred to as a "first space") ER in a planar view (when viewed from above), which is a part of the space surrounded by the first platform tower 14, the second platform tower 16, and panels 98 and 99 (the exposure chamber), and a space in which at least a part of projection optical system PL, that is, in the embodiment, the section above barrel platform 32 described earlier is at least placed. As is shown in FIG. 16, in exposure apparatus 100 of the embodiment, at the corner section in the −X direction and the −Y direction inside the first space ER, a blowout unit (a supply section) BU that has a triangular prism shape is placed with the vertical direction serving as the longitudinal direction. Blowout unit BU connects to air conditioner 25 previously described via a piping system such as a duct and the like. Further, on the surface of blowout unit BU that faces projection optical system PL, for example, a net shaped (mesh shaped) blowout openings, or a multiple blowout holes (omitted in the drawing) is formed, and from the blowout surface, gas such as air that has been adjusted to a predetermined temperature blows out moderately. Furthermore, inside blowout unit BU or on a gas supply path of air conditioner 25 including the piping system previously described, for example, a filter unit that includes a ULPA (or a HEPA) filter is arranged, and foreign materials are removed from the air supplied to the first space ER. In the embodiment, the air conditioning unit including air conditioner 25 or the like circulates the air within the first space ER by a side flow method. That is, the clean air whose temperature is controlled and is supplied to the first space ER via the filter unit and the blowout surface flows in a substantially laminar flow along a diagonal line of the first space ER. The filter unit can include a chemical filter, and in this case, a chemically clean air can be supplied.

Meanwhile, at the corner section in the +X direction and the +Y direction inside the first space ER, a suction unit (a recovery section) SU that has a triangular prism shape is placed with the vertical direction serving as the longitudinal direction, and also facing projection optical system PL. On the surface of suction unit SU that faces projection optical system PL, for example, a plurality of openings is formed. Further, suction unit SU connects to air conditioner 25 previously described via the piping system (not shown), the chemical filter and the like. Incidentally, instead of configuring the circulation system of the air in the manner described above, the air suctioned by suction unit SU can be exhausted outside exposure apparatus 100 via the piping system whose inside is set to negative pressure when compared with the first space ER. In either case, as is shown in FIG. 16, inside the first space ER, air is blown out from blowout unit BU and the air flows toward projection optical PL along a diagonal line of the first space ER. Then, the air that has passed the periphery of projection optical system PL flows along the diagonal line, and is suctioned by suction unit SU. That is, inside the first space ER, side flow air-conditioning is performed along the diagonal line of the first space, and the environment within the first space ER (such as temperature) is stabilized. The air within the first space ER can be positively recovered by arranging a gas suction unit in suction unit SU or on a gas recovery path. Further, in the embodiment, a part of the air conditioning unit including air conditioner 25, or in other words blowout unit BU and suction unit SU are placed within the space surrounded by the first platform tower 14, the second platform tower 16, and panels 98 and 99 (the exposure chamber), however, for example, blowout unit BU and suction unit SU can respectively be arranged in the first platform tower 14 and the second platform tower 16. Furthermore, in the embodiment, the air is circulated along a direction parallel with the diagonal line, however, in the first space that has a rectangular shape in a planar view, the air can be circulated along a direction that intersects the diagonal line.

Further, in the space (hereinafter called a "second space") lower than the first space ER (barrel platform 32) of the exposure chamber previously described, wafer stage WST is placed and the space also includes the periphery where the laser beams of the laser interferometer system passes. Therefore, although it is omitted in the drawings, in exposure apparatus 100 of the embodiment, clean gas (such as air) whose temperature is controlled is circulated also in the second space, and air conditioning (environment stabilization) is performed. In this case, the air described above can be guided to the second space via the first space ER, however, in the second space, an air conditioning different from the first space ER is performed. In the embodiment, in the second space, as an example, a so-called downflow air conditioning is performed. More specifically, a supply opening is arranged above the second space, for example, on the lower surface side of barrel platform 32 and/or measurement mount 36, and a recovery opening is arranged on the upper surface side of wafer base 52 and/or base plate 12. Then, the clean air whose temperature is controlled and is supplied from air conditioner 25 previously described is guided to the supply opening, and the air is circulated within the second space by the downflow method, and the air is recovered via the recovery opening and the piping. In the exposure apparatus that has the configuration described above, in the first space ER there are no obstacles that cut off the air flow in the periphery of projection optical system PL, and the flow is smooth. Especially when the barrel of projection optical system PL is a hollow cylindrical shape, the air flows smoothly in the entire periphery. Further, because the air whose temperature is controlled flows along projection optical system PL (or in other words, projection optical system PL is enfolded in the air), the air functions to protect projection optical system PL, for example, from changes in the external environment or the like. Therefore, the environment (such as temperature) inside the first space ER, and as a consequence, the optical properties of projection optical system PL can be stabilized. In the embodiment, the air conditioning in the second space is performed using a part of the air conditioning unit previously described, however, a different air conditioning unit can be used in the first space and the second space. Further, in the embodiment, the air whose temperature is controlled is used, however, instead of the air, other gases can be used such as, for example, inert gas (including nitrogen or the like), dry air or the like.

As is described so far, according to exposure apparatus 100 of the embodiment, the apparatus comprises the first platform tower 14 and the second platform tower 16, and exposure main section 18 arranged in the space between the first platform tower 14 and the second platform tower 16 including reticle stage module 24 serving as a plurality of high rigidity sections including high rigidity components, projection optical system model 26, and wafer stage module 28. In other words, exposure apparatus 100 is not equipped with a frame mechanism that serves as a body. Accordingly, when designing an exposure apparatus of the next generation or when customizing an existing exposure apparatus, the base platform does not have to be changed. Accordingly, the body structure (platform) of the embodiment increases the degree of freedom of design, and the body structure can also be said to have a suitable structure for the so-called module design. That is, by employing a configuration like exposure apparatus 100, it becomes possible to use the module of the preceding generation even if the generation changes and it also becomes possible to reduce the weight of the entire apparatus, the cost, and the making time of the apparatus. Meanwhile, because the distance between the first platform tower 14 and the second platform tower 16 can be arbitrarily set, it becomes easy to cope with the situation in the case the size of modules 24, 26, and 28 increases.

Further, in projection optical system module 26, mini-bridge 30, which is a high rigidity component, and barrel platform 32 and the barrel of projection optical system PL, which are also high rigidity components, are connected by the wires (35A to 35C) serving as connection members and the Z vibration isolation pads (38A to 38C) that have a flexible structure. Further, barrel platform 32 and measurement mount 36 are connected using three rods 34 that have flexure sections on the top and bottom ends. As is described, by employing connection members with a flexible structure, less high rigidity components are used, which can reduce the making cost, as well as suppress vibration, heat and the like from traveling between high rigidity components compared with the case when connection members with a rigid structure (such as the conventional lens column or the like) are used.

Further, in projection optical system module 26 that exposure apparatus 100 is equipped with as is described above, barrel platform 32 and the barrel of projection optical system PL that have a rigid structure are supported by suspension in an active suspension method with respect to mini-bridge 30 also having a rigid structure, via Z vibration isolation pads 38A to 38C and wires 35A to 35C serving as connection members with a flexible structure. Therefore, the following advantages can be given.

1) The exposure apparatus is made of a combination of extremely simple structures, which allows the weight to be reduced, and the making cost can be reduced. Further, because rigid structures are supported by a flexible structure, influence of vibration and/or heat can be reduced, which can achieve independency of the module.

2) Projection optical system PL is supported by suspension, and since the natural vibration frequency of the connection member (or as a consequence, projection optical system PL) especially of vibration perpendicular to the optical axis is extremely small, influence of vibration from the floor surface is greatly reduced. Accordingly, the performance of the apparatus such as vibration isolation performance and exposure accuracy (overlay accuracy) improves. And, even if vibration happens to cause a problem, the traveling path of the vibration can be easily specified, and countermeasures can easily be taken such as for example, adding vibration isolation members to the section to which the vibration travels.

3) In the case the environment temperature of the exposure apparatus changes, heat distortion of the structure becomes easy to predict, therefore, by measuring the temperature of each section of the structure using temperature sensors, position setting errors or the like can also be corrected according to the measurement results.

Further, in the reticle stage module that exposure apparatus 100 is equipped with, reticle coarse movement stage 120 and reticle fine movement stage 130 are rigid structure components, and Z-axis support mechanisms 134a to 134c that connect reticle coarse movement stage 120 and reticle fine movement stage 130 are flexible structure components. In the embodiment, rigid structure is used for components such as reticle coarse movement stage 120 and reticle fine movement stage 130 that directly affect the performance of the reticle stage module, which as a consequence affects the performance of the apparatus, and flexible structure is used for section where travel of vibration should be cut off. Accordingly, it becomes possible to reduce the weight of mechanical sections while maintaining a high performance state of the reticle stage module.

Further, in the wafer stage module that the exposure apparatus is equipped with, wafer stage WST, stators 86XE and 86XF, damper members 97A, 97B, 97C, and 97D and the like are rigid structure components, and mechanical filter members 72A and 72B that respectively connect stator 86XE and damper members 97A and 97B, mechanical filter members 72C and 72D and the like that respectively connect stator 86XF and damper members 97C and 97D are flexible structure components.

Further, in exposure apparatus 100 of the embodiment, in the first space ER previously described, side flow air conditioning is employed, whereas in the second space, downflow air conditioning is employed. Accordingly, the environment (such as temperature) of the space in which the projection optical system PL is placed can be stabilized, and measurement with high stability using the laser interferometer system (and focal point position detection system (focus detection system), wafer alignment system) and the like fixed to measurement mount 36 can be performed, which leads to an improvement in position controllability of the wafer stage, exposure accuracy (including alignment accuracy) and the like.

Further, since the side flow air conditioning along a diagonal line that was previously described is employed, no unnecessary obstacles are arranged at the front surface and the back surface of exposure apparatus 100 where panels 98 and 99 are placed, therefore, maintenanceability is improved, as well as the degree of freedom of placement of each component inside the first space.

Further, according to the making method of the exposure apparatus related to the embodiment, rectangular shaped base plate 12 is installed on floor surface F, and with base plate 12 in between, the first platform tower 14 is installed on floor surface F adjacent to one side of base plate 12 and the second platform tower 16 is installed on floor surface F adjacent to the other side of base plate 12. Then, in a simple procedure of sequentially placing modules 24, 26, 28 serving as a plurality of high rigidity sections including high rigidity components in the space between the first platform tower 14 and the second platform tower 16, it becomes possible to assemble the above sections into main section 18.

In this case, the order of placing modules 24, 26, and 28 can be of any order. Accordingly, the workability is good when assembling the above modules into main section 18. Especially, in the case the exposure apparatus is equipped with exposure main section 18 including reticle stage module 24, projection optical system module 26, and wafer stage module 28 serving as a plurality of high rigidity sections placed in the space between the first platform tower 14 and the second platform tower 16, as in exposure apparatus 100 related to the embodiment, by performing mechanical, electrical, and optical adjustment of each module prior to assembling the above modules into exposure main section 18, the adjustment after assembling the above modules into exposure main section 18 becomes extremely simple.

In the above embodiment, the case has been described where exposure main section was places in the space between the first platform tower 14 and the second platform tower 16, however, the present invention is not limited to this, and instead of the first platform tower 14 and the second platform tower 16, for example, a first frame and a second frame of a frame structure (including an oar structure or the like) can be employed. Further, the configuration of exposure main section 18 is not limited to the ones in the above embodiment, and various configurations can be employed. Furthermore, not only can the first platform tower 14 and the second platform tower 16 be arranged independently on a predetermined installation surface (such as the floor surface), but the towers can also be connected with a connection member. Further, not only exposure main section 18 but also the first platform tower 14 and the second platform tower 16 can also be placed on base plate 12, or the entire exposure apparatus (14, 16, and 18) can be mounted (fixed) on a frame caster. Further, in the above embodiment, the making process of the exposure apparatus has been described, however, for example, in the case where the exposure apparatus with the above body structure in which assembly and final adjustment have been completed is disassembled into module units and carried to a device manufacturing factory (clean room) of a device manufacturer, and the exposure apparatus is started up in the clean room, a similar assembly and adjustment can be performed as in the above embodiment, and the start-up time of the exposure apparatus until the exposure apparatus begins functioning (operating) can be reduced. Furthermore, because it is extremely easy to attach/detach the modules in the exposure apparatus with the above body structure, it becomes possible to reduce the adjustment (maintenance) time, even in the case, for example, when the projection optical system is taken out from the exposure apparatus main section for optical adjustment after the exposure apparatus begins operation.

In the above embodiment, the case has been described where a part of the illumination optical system (the second illumination unit 22) placed above reticle stage module 24 is arranged outside the main section chamber of exposure apparatus 100 made up of the first platform tower 14, the second platform tower 16, and panels 98 and 99. However, the part of the illumination optical system and/or a different unit (module), such as for example, the mark detection system for detecting the alignment marks of the reticle can also be housed within the main section chamber. Furthermore, in the above embodiment, wafer stage module 28 (wafer base 52) can be placed on base plate 12 via vibration isolation members, or a different unit (module) of exposure apparatus 100 can be supported with vibration isolation members.

Further, in the above embodiment, the positional information of the reticle stage and the wafer stage was measured using an interferometer system, however, the present invention is not limited to this, and for example, an encoder system that detects a scale (diffraction grating) arranged on the upper surface of the wafer stage can also be used. In this case, the system can be a hybrid system equipped with both the interferometer system and the encoder system, and calibration of the measurement results of the encoder system is preferably performed using the measurement results of the interferometer system. Further, position control of the wafer stage can be performed switching between the interferometer system and the encoder system, or by using both of the systems.

In the above embodiment, for example, a harmonic wave may also be used as the illumination light, which is obtained by amplifying a single-wavelength laser beam in the infrared or visible range emitted by a DFB semiconductor laser or fiber laser, with a fiber amplifier doped with, for example, erbium (or both erbium and ytteribium), and by converting the wavelength into ultraviolet light using a nonlinear optical crystal, as is disclosed in, for example, the pamphlet of International Publication WO1999/46835 (the corresponding U.S. Pat. No. 7,023,610).

Further, the magnification of the projection optical system is not limited to a reduction system, and the system may be either an equal magnifying system or a magnifying system. The projection optical system is not limited to a refracting system, and the system can be either a reflection system or a catadioptric system, and the projected image can be either an inverted image or an upright image. As is disclosed in, for example, the pamphlet of International Publication WO2004/107011, the so-called inline type catodioptric system, which has an optical system (a reflection system or a deflexion system) that has a plurality of reflection surfaces and forms an intermediate image at least once arranged in a part of the catodioptric system and also has a single optical axis, can also be used. Further, the barrel of the projection optical system is not limited to a hollow cylindrical shape, and other shapes, such as for example, a hollow cylindrical shaped barrel with a part of the barrel protruding can also be employed.

In the above embodiment, the case has been described where the present invention was applied to a scanning exposure apparatus by the step-and-scan method, but the present invention is not limited to this, and the present invention can be suitably applied to an exposure apparatus by the step-and-repeat method (the so-called stepper), an exposure apparatus by the a step-and-stitch method, and exposure apparatus by a proximity method, a mirror projection aligner and the like.

Besides the above exposure apparatus, the present invention can also be applied to a liquid immersion exposure apparatus that has liquid filled in a space between projection optical system PL and the wafer whose details are disclosed in, for example, the pamphlet of International Publication WO2004/053955 (the corresponding U.S. Patent Application Publication 2005/0252506), U.S. Pat. No. 6,952,253, European Patent Application Publication No. 1420298, the pamphlet of International Publication WO2004/055803, the pamphlet of International Publication WO2004/057590, U.S. Patent Application Publication 2006/0231206, U.S. Patent Application Publication 2005/0280791 and the like. In this liquid immersion exposure apparatus, the liquid immersion system for supplying liquid in the space between the projection optical system and the wafer can be supported by suspension independently from the projection optical system. Further, the present invention can be applied not only to an exposure apparatus that uses exposure illumination light in the far ultraviolet region or vacuum ultraviolet region, but also to an exposure apparatus that uses an EUV light, an X-ray, or a charged particle beam such as an electron beam or an ion beam. The exposure apparatus in the above embodiment can be a twin stage type exposure apparatus that can substantially perform exposure operation and measurement operation (e.g. mark detection by the alignment system or the like) in parallel using two wafer stages whose details are disclosed in, for example, Kokai (Japanese Unexamined Patent Publication) No. 10-214783 (the corresponding U.S. Pat. No. 6,590,634), U.S. Pat. No. 5,969,441, the pamphlet of International Publication WO98/40791 and the like. Furthermore, the exposure apparatus in the above embodiment can be equipped with a measurement stage that has a measurement member (e.g. a fiducial mark, an optical sensor or the like) separately from the wafer stage, as is disclosed in, for example, the pamphlet of International Publication WO2005/074014, the pamphlet of International Publication WO1999/23692, U.S. Pat. No. 6,897,963 and the like.

In the above embodiment, a transmittance type mask, which is a transmissive substrate on which a predetermined light shielding pattern (or a phase pattern or a light attenuation pattern) is formed, was used. Instead of this mask, however, as is disclosed in, for example, U.S. Pat. No. 6,778,257, an electron mask (also called a variable shaped mask, including for example, a DMD (Digital Micromirror Device), which is a kind of a non-radiative image display device (also referred to as a spatial optical modulator), or the like) on which a light-transmitting pattern, a reflection pattern, or an emission pattern is formed according to electronic data of the pattern that is to be exposed can also be used. Further, the present invention can also be applied to an exposure apparatus (lithography system) that forms line-and-space patterns on wafer W by forming interference fringes on wafer W, as is disclosed in, for example, the pamphlet of International Publication WO2001/035168. Furthermore, the present invention can also be applied to an exposure apparatus that synthesizes patterns of two reticles on a wafer via a double-head type projection optical system, and performs double exposure of a shot area on the wafer almost simultaneously in one scanning exposure, as is disclosed in, for example, Kohyo (Japanese Unexamined Patent Publication) No. 2004-519850 (the corresponding U.S. Pat. No. 6,611,316).

The above disclosures of the various publications, the pamphlet of the International Publications, the U.S. Patent Application Publications, and the U.S. Patent descriptions are each incorporated herein by reference.

Further, in the case of manufacturing semiconductor devices using the exposure apparatus in the above embodiment, the semiconductor devices are manufactured through the following steps: a step where the function/performance design of a device is performed; a step where a reticle based on the design step is manufactured; a step where a wafer is manufactured using materials such as silicon; a step where the pattern of the reticle is transferred onto the wafer using the exposure apparatus in the above embodiment; a step where a circuit pattern is formed by etching or the like, a device assembly step (including processes such as a dicing process, a bonding process, and a packaging process); an inspection step, and the like.

Further, the application of the present invention is not limited to the exposure apparatus for manufacturing semiconductors, and the present invention can also be widely applied to an exposure apparatus used for manufacturing display units such as a liquid crystal display device made of a square glass plate, a plasma display or the like, or to an exposure apparatus used for manufacturing imaging devices (such as CCDs), micromachines, MEMS (Micro Electro Mechanical Systems), thin film magnetic heads, DNA chips and the like. Furthermore, the present invention can also be applied to an exposure apparatus that manufactures a mask (a photomask, a reticle and the like) on which a mask pattern of the various devices is formed using a lithography process. Furthermore, the object subject to exposure is not limited to a semiconductor wafer for manufacturing semiconductor devices, and the object can be other things, such as a glass substrate for a display device, a ceramic wafer for a thin film magnetic head, an original plate (synthetic silica glass, silicon wafer) of a mask or a reticle used in an exposure apparatus, a film member or the like. Further, the shape of the object is not limited to a circular shape, and it can be other shapes such as a rectangular shape or the like.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. An exposure apparatus that forms a pattern by exposing a substrate, the apparatus comprising:
   a first frame and a second frame installed on a predetermined surface so as to be spaced apart from each other by a predetermined distance in a first direction, each of the first frame and the second frame having a support section that protrudes into a space between the first frame and the second frame such that there is a space above and below each support section in the space between the first frame and the second frame; and
   an exposure main section arranged within the space between the first frame and the second frame that includes a plurality of high rigidity sections each including a high rigidity component,
   wherein the plurality of high rigidity sections include at least one high rigidity section that is supported by the support section arranged in the first frame and the support section arranged in the second frame and is inserted into the space and withdrawn from the space along a second direction intersecting the first direction, and
   the at least one high rigidity section has at least one guide member supported by the support section arranged in the first frame and at least one guide member supported by the support section arranged in the second frame.

2. The exposure apparatus of claim 1 wherein
at least one of the plurality of high rigidity sections includes a plurality of high rigidity components and a connection member of a flexible structure that connects the high rigidity components.

3. The exposure apparatus of claim 1 wherein
the exposure main section includes a first module including an optical system that generates a predetermined pattern as the high rigidity component and a second module including a substrate stage that moves holding the substrate as the high rigidity component.

4. The exposure apparatus of claim 3 wherein
the first module includes a frame member as the high rigidity component by which the optical system is supported by suspension via a connection member of a flexible structure.

5. The exposure apparatus of claim 3 wherein
the exposure main section further includes a third module including a mask stage that holds a mask as the high rigidity component.

6. The exposure apparatus of claim 5 wherein
the mask stage and the substrate stage are moved synchronously to form the pattern on the substrate via the mask, and the mask stage holds a plurality of masks which are lined in a direction of the synchronous movement.

7. The exposure apparatus of claim 5 wherein
the first, second and third modules have a structure that can isolate external vibration to each of the high rigidity components.

8. The exposure apparatus of claim 5, the apparatus further comprising:
an illumination device that illuminates the mask with an illumination light, the device including a first illumination section arranged in one frame of the first frame and the second frame and a second illumination section that optically connects to the first illumination section.

9. The exposure apparatus of claim 3, the apparatus further comprising:
a temperature adjusting device that makes gas flow inside a first space that has a rectangular shape in a planar view between the first frame and the second frame in which at least a part of the optical system is placed, along a diagonal line of the rectangular shape.

10. The exposure apparatus of claim 9 wherein
the temperature adjusting device makes the gas flow toward the optical system.

11. The exposure apparatus of claim 10 wherein
the temperature adjusting device includes a recovery section into which the gas that has passed a periphery of the optical system flows.

12. The exposure apparatus of claim 9 wherein
the temperature adjusting device includes a supply section that supplies gas into the first space and a recovery section into which the gas inside the first space flows, and the supply section and the recovery section are placed with the optical system in between.

13. The exposure apparatus of claim 9 wherein
the temperature adjusting device makes gas flow inside a second space independently from the first space, between the first frame and the second frame in which the substrate stage is placed.

14. The exposure apparatus of claim 13 wherein
the temperature adjusting device makes the gas flow in the second space by a downflow method.

15. The exposure apparatus of claim 9 wherein
in the exposure main section, the pattern is formed on the substrate via a mask, and the apparatus further comprises:
an illumination device that illuminates the mask with an illumination light and has a part of the device arranged in one frame of the first frame and the second frame, whereby
a part of the temperature adjusting device is arranged in the one frame of the first frame and the second frame.

16. The exposure apparatus of claim 3, the apparatus further comprising:
a temperature adjusting device that makes gas flow inside a first space that has a rectangular shape in a planar view between the first frame and the second frame in which at least a part of the optical system is placed, by a side flow method.

17. The exposure apparatus of claim 3 wherein
in the exposure main section, the pattern is formed on the substrate via a mask, and the apparatus further comprises:
an illumination device that illuminates the mask and has a part of the device arranged in one frame of the first frame and the second frame; and
a carrier system of the mask and/or the substrate that has at least a part of the system arranged in the other frame of the first frame and the second frame.

18. The exposure apparatus of claim 3 wherein
each of the support sections is a guide, and
a module other than the second module can be inserted from the outside along the guide into a space between the first frame and the second frame.

19. The exposure apparatus of claim 1, the apparatus further comprising:
an electric substrate rack that is arranged in at least one frame of the first frame and the second frame.

20. The exposure apparatus of claim 1 wherein
the first frame and the second frame are both a platform tower.

21. The exposure apparatus of claim 1, wherein the at least one guide member is a roller guide.

22. The exposure apparatus of claim 1 wherein the first frame and the second frame extend in parallel with each other.

23. A method of making an exposure apparatus that forms a pattern by exposing a substrate, the method comprising:
installing a first frame and a second frame on a predetermined surface so as to be spaced apart from each other by a predetermined distance in a first direction, each of the first frame and the second frame having a support section that protrudes into a space between the first frame and the second frame such that there is a space above and below each support section in the space between the first frame and the second frame; and
placing an exposure main section including a plurality of high rigidity sections distanced apart that each include a high rigidity component, in the space between the first frame and the second frame, wherein
in the placing, at least one of the plurality of high rigidity sections is supported by the support section arranged in the first frame and the support section arranged in the second frame, and is inserted into the space along a second direction intersecting the first direction, and
the at least one of the plurality of high rigidity sections is inserted into the space via at least one guide member supported by the support section arranged in the first frame and at least one guide member supported by the support section arranged in the second frame, the at least one of the plurality of high rigidity sections having the guide members.

24. The method of claim 23, the method further comprising:
installing a base plate on the surface, on which a part of the exposure main section is placed.

25. The method of claim 24 wherein
the first frame and the second frame are installed with the base plate in between.

26. The method of claim 24 wherein
each of the support sections is a guide, and
the exposure main section includes a first module including an optical system that generates a predetermined pattern as the high rigidity component and a second module including a substrate stage that moves holding the substrate as the high rigidity component, whereby
in the placing, the first module is inserted from the outside into a space between the first frame and the second frame along the corresponding guide, and the second module is placed on the base plate.

27. The method of claim 26 wherein
the exposure main section further includes a third module including a mask stage that holds a mask as the high rigidity component, and
in the placing, the third module is inserted from the outside into a space between the first frame and the second frame along the guide corresponding to the third module.

28. The method of claim 27, the method further comprising:
assembling an illumination device that illuminates the mask with an illumination light by optically connecting to a first illumination section arranged in one frame of the first frame and the second frame, a second illumination section.

29. The method of claim 28, the method further comprising:
assembling into the one frame a temperature adjusting device that makes gas flow inside the space between the first frame and the second frame.

30. The method of claim 28, the method further comprising:
assembling into the other frame of the first frame and the second frame a carrier system of the mask and/or the substrate.

31. The method of claim 23, the method further comprising:
assembling an electric substrate rack that is arranged in at least one frame of the first frame and the second frame.

32. The method of claim 23, the method further comprising:
fixing a panel to each of the first frame and the second frame in a state where the space between the first frame and the second frame is covered.

33. The method of claim 23 wherein
as the first frame and the second frame, platform towers are used.

34. The method of claim 23, wherein the guide members are roller guides.

35. The method of claim 23 wherein the first frame and the second frame extend in parallel with each other.

36. An exposure apparatus that exposes a substrate with a radiation beam, the apparatus comprising:
a pair of frames installed on a predetermined surface so as to be spaced apart from each other by a predetermined distance in a first direction, each of the pair of frames having a support section that protrudes into a space between the pair of frames such that there is a space above and below each support section in the space between the pair of frames; and
an exposure main section attached to the pair of frames, the exposure main section including a plurality of high rigidity sections that each include a high rigidity component, wherein
at least one of the plurality of high rigidity sections is inserted in a second direction intersecting the first direction, and has a plurality of guide members supported by the support sections arranged in the pair of frames.

37. The exposure apparatus of claim 36, wherein the plurality of guide members are roller guides.

38. The exposure apparatus of claim 36 wherein the pair of frames extend in parallel with each other.

39. An exposure apparatus that exposes a substrate with a radiation beam, the apparatus comprising:
a pair of frames installed on a predetermined surface so as to be spaced apart from each other by a predetermined distance in a first direction, each of the pair of frames having a support section that protrudes into a space between the pair of frames such that there is a space above and below each support section in the space between the pair of frames; and
an exposure main section having at least one high rigidity section inserted into the space between the pair of frames along a second direction intersecting the first direction, with at least a part of the exposure main section attached to the pair of frames,
wherein the at least one high rigidity section has a plurality of guide members supported by the support sections arranged in the pair of frames.

40. The exposure apparatus of claim 39 wherein
the exposure main section can have at least a part of the exposure main section withdrawn outside the space along the second direction.

41. The exposure apparatus of claim 39 wherein
the exposure main section includes an optical system that generates a predetermined pattern.

42. The exposure apparatus of claim 41 wherein
the exposure main section includes a frame member that supports the optical system by suspension within the space.

43. The exposure apparatus of claim 39 wherein
the exposure main section includes a plurality of modules that are arranged independently within the space.

44. The exposure apparatus of claim 43 wherein
at least one of the plurality of modules can be withdrawn outside the space independently from other modules.

45. The exposure apparatus of claim 43 wherein
one of the plurality of modules includes a projection system.

46. The exposure apparatus of claim 43 wherein
one of the plurality of modules includes a substrate stage.

47. The exposure apparatus of claim 39, the apparatus further comprising:
a module that has at least a part of the module arranged in one of or both of the pair of frames.

48. The exposure apparatus of claim 47 wherein
the module includes a carriage system that delivers an object into the exposure main section.

49. The exposure apparatus of claim 48 wherein
the object includes the substrate.

50. The exposure apparatus of claim 47 wherein
the module includes a gas supply section that supplies gas whose temperature is controlled into the space.

51. The exposure apparatus of claim 39, wherein the plurality of guide members are roller guides.

52. The exposure apparatus of claim 39 wherein the pair of frames extend in parallel with each other.

* * * * *